US012774295B2

(12) United States Patent
Jilek et al.

(10) Patent No.: US 12,774,295 B2
(45) Date of Patent: Oct. 27, 2026

(54) DEUTERATED ORGANOTIN COMPOUNDS, METHODS OF SYNTHESIS AND RADIATION PATTERNING

(71) Applicant: Inpria Corporation, Corvallis, OR (US)

(72) Inventors: Robert E. Jilek, Philomath, OR (US); Brian J. Cardineau, Corvallis, OR (US); Kierra Huihui-Gist, Albany, OR (US); Stephen T. Meyers, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 1101 days.

(21) Appl. No.: 17/682,586

(22) Filed: Feb. 28, 2022

(65) Prior Publication Data

US 2022/0411446 A1 Dec. 29, 2022

Related U.S. Application Data

(60) Provisional application No. 63/215,720, filed on Jun. 28, 2021.

(51) Int. Cl.

| | |
|---|---|
| ***C07F 7/22*** | (2006.01) |
| ***G03F 7/16*** | (2006.01) |
| ***G03F 7/20*** | (2006.01) |
| ***G03F 7/32*** | (2006.01) |
| ***G03F 7/38*** | (2006.01) |

(52) U.S. Cl.

CPC .......... *C07F 7/2284* (2013.01); *C07F 7/2224* (2013.01); *G03F 7/162* (2013.01); *G03F 7/2004* (2013.01); *G03F 7/325* (2013.01); *G03F 7/38* (2013.01)

(58) Field of Classification Search

CPC ........ C07F 7/2284; C07F 7/2224; C07F 7/22; C07F 7/2208; G03F 7/2004; C07B 2200/05

See application file for complete search history.

(56) References Cited

U.S. PATENT DOCUMENTS

| | | | | |
|---|---|---|---|---|
| 9,310,684 | B2 | 4/2016 | Meyers et al. | |
| 10,228,618 | B2 * | 3/2019 | Meyers | G03F 7/16 |
| 10,787,466 | B2 * | 9/2020 | Edson | C07F 7/2284 |
| 10,975,109 | B2 * | 4/2021 | Edson | C07F 7/2284 |
| 11,498,934 | B2 * | 11/2022 | Clark | G03F 7/2004 |
| 11,897,906 | B2 * | 2/2024 | Edson | C07F 7/2284 |
| 2002/0076576 | A1 * | 6/2002 | Li | H10K 85/342 428/917 |
| 2019/0315781 | A1 | 10/2019 | Edson et al. | |
| 2020/0117085 | A1 | 4/2020 | Moon et al. | |
| 2020/0124970 | A1 | 4/2020 | Kocsis et al. | |
| 2020/0241413 | A1 | 7/2020 | Clark et al. | |
| 2020/0326627 | A1 | 10/2020 | Jiang et al. | |
| 2022/0006419 | A1 | 1/2022 | Conrad et al. | |

FOREIGN PATENT DOCUMENTS

| | | | |
|---|---|---|---|
| JP | 2005-075802 | A | 3/2005 |
| WO | 2012-021634 | A2 | 2/2012 |
| WO | 2019-023797 | A1 | 2/2019 |
| WO | 2019-217749 | A | 11/2019 |
| WO | 2020-264158 | A | 12/2020 |
| WO | 2023-245047 | A1 | 12/2023 |

OTHER PUBLICATIONS

W. Meier-Augenstein et al., Stable Isotope Analysis: General Principles and Limitations, In Wiley Encyclopedia of Forensic Science, 1-15 (2012) (Year: 2012).*

A. M. Helmenstine, Deuterium Facts, 2019. (Year: 2019).*

D. Haenssgen et al. 17 (4) Chemischer Informationsdienst 140-141 (1986) (Year: 1986).*

CAS abstract RN 76178-63-7 (1984) (Year: 1984).*

E. Kaletová, et al. 137 Journal of the American Chemical Society 12086-12099 (2015)("Kaletová") (Year: 2015).*

CAS Abstract-CASreact (Year: 2022).*

CAS Abstract, E. Bogoradovskii et al, 50 Zhurnal Obshchei Khimii, 2031-2040 (1980) (Year: 1980).*

CASREACT Abstract of I. Shono et al., WO 2022102636 (2022) (Year: 2022).*

Belyakov et al., "Vibrational Spectra of (CH3)3SnC=CH, (CD3)3Sn=CH and (CD3)3SnC=CD and Force Field of Trimethylstannyl-Acetylene", Journal of Molecular Structure, vol. 98, p. 27-38, (Jan. 1, 1983).

Hutton et al., "Monoalkytin Trihalides: Synthetic, Mechanistic and Spectroscopic Aspects", Journal of Organometallic Chemistry, vol. 156, p. 369-382, (Jan. 1, 1978).

(Continued)

*Primary Examiner* — Alexander R Pagano
*Assistant Examiner* — Frank S. Hou
(74) *Attorney, Agent, or Firm* — Christensen, Fonder, Dardi; Diane E. Bennett; Peter S. Dardi

(57) ABSTRACT

Organotin compounds are presented that are represented by the formula $RSnL_3$, wherein R is a deuterated hydrocarbyl group and L is a hydrolysable ligand. Two different synthesis techniques are described for synthesizing these compositions. A first method involves reacting a primary halide hydrocarbyl compound (R—X, where X is a halide atom) with an organometallic composition comprising $SnL_3$ moieties associated with metal cations M, where M is an alkali metal, alkaline earth metal, and/or pseudo-alkaline earth metal (Zn, Cd, or Hg), and L is either an amide ligand resulting in an alkali metal tin triamide compound or an acetylide ligand resulting in an alkali metal tin triacetylide, to form correspondingly a monohydrocarbyl tin triamide ($RSn(NR'_2)_3$) or a monohydrocarbyl tin triacetylide ($RSn(C{\equiv}CR_s)_3$). An alternative approach involves reacting a Grignard reagent RMgX with $SnL_4$ in a solution comprising an organic solvent to form a monoorgano tin tralkylamide, a monoorgano tin trialkoxide, monoorgano tin tri acetylide or monoorgano tin tricarboxylate. The compositions are useful for radiation patterning, especially with EUV radiation.

18 Claims, 9 Drawing Sheets

(56) References Cited

OTHER PUBLICATIONS

Kimmel et al., "Vibrational Spectra of Organotin Compounds—III Infrared Spectra and Normal Coordinate Analysis of Methylstannane*†‡", Spectrochimica Acta, vol. 24A, p. 909-919, (Jan. 1, 1968).
Pommier et al., "Etude de la Reaction D'Oxydation D'Alcools Par Voie Organostannique", Journal of Organometallic Chemistry, vol. 74, p. 405-416, (1974).
Wolzak et al., "Mechanistic elucidation of monoalkyltin(iv)-catalyzed esterification", Catalysis Science & Technology, vol. 11 No. 10, p. 3326-3332, (Jan. 1, 2021).
Search Report from corresponding European Patent Application No. 22833874.5 dated Mar. 27, 2025.
Laplaza et al., "Tin N-tert-Butylanilide Compounds", Organometallics, vol. 14, p. 577-580, (1995).
Podestá et al., "A convenient preparation of trineophyltin deuteride and some applications including the reduction of organic halides and {alpha}-Halo ketones", Journal of Organic Chemistry, vol. 59, p. 3747-3748, (1994).
International Search Report from corresponding Patent Application No. PCT/US2022/032614 dated Sep. 20, 2022.

* cited by examiner

DEUTERATED ORGANOTIN COMPOUNDS, METHODS OF SYNTHESIS AND RADIATION PATTERNING

CROSS REFERENCE TO RELATED APPLICATIONS

This application claims priority to copending U.S. provisional patent application 63/215,720 to Jilek et al. filed Jun. 28, 2021, entitled "Deuterated Organotin Compounds," incorporated herein by reference.

FIELD OF THE INVENTION

The invention relates to compositions of mono-organotin triamides, mono-organotin triacetylides, mono-organo carboxylates or mono-organotin trioxides, wherein the organo group is defined as a hydrocarbyl containing deuterated moieties. The invention further relates to hydrolysis products, to synthesis of the compositions, and to methods of performing radiation patterning.

BACKGROUND

Semiconductor manufacturing generally requires many iterative processes to integrate devices on a chip. A key process in the manufacture of semiconductor devices is a lithographic process wherein a photosensitive material, known as a photoresist, is deposited onto a substrate and then patterned using radiation. As demand for higher performance devices grows, the need for better photoresists also increases.

Photoresists generally function by undergoing a chemical change in regions that are exposed to a source of radiation, such as ultraviolet (UV) light, extreme ultraviolet (EUV) light, and electron beams. The chemical change induces a differential development rate between the exposed and unexposed regions of the photoresist. State of the art semiconductor device manufacturing currently employs EUV radiation, therefore a need exists for new photoresist materials to maximize the economy of the lithographic process.

SUMMARY OF THE INVENTION

One aspect of the invention pertains to an organotin compound represented by the formula $RSnL_3$, wherein R is a deuterated hydrocarbon group.

In another aspect, the invention pertains to an organotin compound represented by the formula $(CD_3)_3CSnL_3$, wherein L is a hydrolysable ligand.

In another aspect, the invention pertains to an organotin compound represented by the formula $CD_3SnL_3$, wherein L is a hydrolysable ligand.

In another aspect, the invention pertains to a method of preparing a radiation-patternable coating of a deuterated organotin compound. Specifically, the synthesis and coating formation are contemplated.

In another aspect, the invention pertains to a method of patterning a radiation-sensitive coating comprising at least one deuterated organotin composition. Patterning with EUV radiation is of particular interest. The invention can also pertain to the resulting patterned structure.

In some aspects, the invention pertains to an organotin compound represented by the formula $RSnL_3$, wherein R is a deuterated hydrocarbyl group and L is a hydrolysable ligand.

In a further aspect, the invention pertains to a method for synthesizing a deuterated organotin composition, the method comprising: reacting a primary halide hydrocarbyl compound (R—X, where X is a halide atom) with an organometallic composition comprising $SnL_3$ moieties associated with metal cations M, where M is an alkali metal, alkaline earth metal, and/or pseudo-alkaline earth metal (Zn, Cd, or Hg), and L is either an amide ligand resulting in an alkali metal tin triamide compound or an acetylide ligand resulting in an alkali metal tin triacetylide, to form correspondingly a monohydrocarbyl tin triamide ($RSn(NR'_2)_3$) or a monohydrocarbyl tin triacetylide ($RSn(C{\equiv}CR^s)_3$), where the monohydrocarbyl ligand (R) is a deuterated hydrocarbyl group with from 1 to 31 carbon atoms and optional unsaturated carbon-carbon bonds, optional aromatic groups and optional hetero atoms, $R^s$ is $SiR''_3$ or R', the three R" are independently H or R', and the R' is independently a hydrocarbyl group with from 1 to 31 carbon atoms and optional unsaturated carbon-carbon bonds, optional aromatic groups and optional hetero atoms, to form the alkali metal tin composition.

The organometallic composition comprising $SnL_3$ moieties associated with metal cations M can be synthesized by a method comprising: reacting M'L, tin (II) halide ($SnX_2$, X=F, Cl, B, I or a mixture thereof) and optionally $M''OR^0$ in an organic solvent, where M' is Li, Na, K, Cs or a combination thereof, M" is Na, K, Cs or a combination thereof, and L is dialkylamide ($—NR'_2$) or acetylide ($—C{\equiv}CL^s$), to form a corresponding organometallic composition with a moiety $SnL_3$, which is tin triamide ($MSn(NR{=}_2)_3$) or tin triacetylide ($MSn(C{\equiv}CL^s)_3$), present with associated metal cations M, where M is M" if present or M' if M" is not present, $L_s$ is $SiR''_3$ or R', the three R" are independently H or R', and the $R^0$ and R' are independently a hydrocarbyl group with from 1 to 31 carbon atoms and optional unsaturated carbon-carbon bonds, optional aromatic groups and optional hetero atoms, to form the alkali metal tin composition.

In another aspect, the invention pertains to a method to form a monoorganotin triamide compound, the method comprising, reacting a Grignard alkylating agent RMgX with $Sn(NR'_2)_4$ in a solution comprising an organic solvent, where R is a hydrocarbyl group with 1-31 carbon atoms and at least one deuterium atom, where X is a halogen, and where R' is a hydrocarbyl group with 1-10 carbon atoms.

In other aspects, the invention pertains to a method for synthesizing a monoorgano tin trialkoxide, monoorgano tin tri acetylide or monoorgano tin tricarboxylate, the method comprising, reacting a Grignard alkylating agent RMgX with $SnL_4$ in a solution comprising an organic solvent, where R is a hydrocarbyl group with 1-31 carbon atoms, where X is a halogen, and where R' is a hydrocarbyl group with 1-10 carbon atoms, and L is R'COO, CCR' or OR', where R' has 1 to 10 carbon atoms and optional heteroatoms. For these reactions, R may or may not be deuterated.

DETAILED DESCRIPTION

Figure 1A:
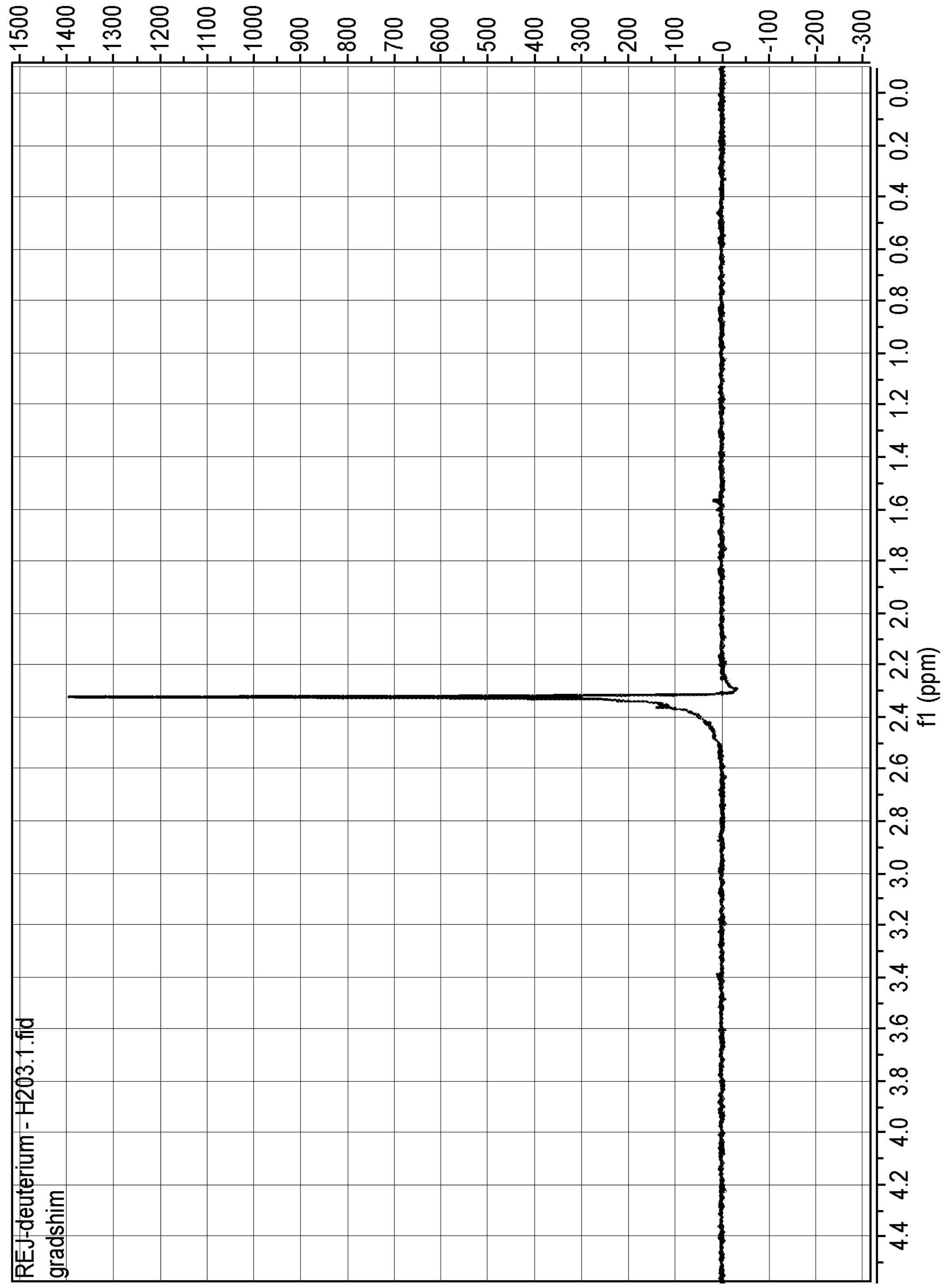
FIG. 1A is a $^2H$ NMR spectrum of d9-tBuSn(O-t-Bu)$_3$ in $C_6D_6$.

Organometallic photoresists incorporating deuterated ligands have been developed to take advantage of potential benefits of the isotope effects. In particular, perdeuterated ligands are disclosed that involve replacement of hydrogen atoms with deuterium atoms. Two distinct alternative synthesis pathways are described and exemplified. Patterning using the exemplified deuterated organometallic resists provide desirable results that are promising as a high resolution patterning resist. The substitution of deuterium for hydrogen atoms can provide alternative properties from different kinetics resulting from the kinetic isotope effects as well as providing different analytical properties that can be useful for purification and/or characterization. Deuterium enrichment can be site(s) specific or replacing all hydrogen atoms in the composition (perdeutero). Tin based organometallic patterning compositions are an important patterning composition to exploit high resolution EUV patterning. Desirable patterning results with deuterated photoresists are described.

Organometallic photoresists, particularly those based on organotin materials, have been shown to operate as high performance radiation patterning compositions, especially as EUV photoresists, that can enable patterning of high-fidelity and high-resolution patterns. These materials can generally operate as positive tone photoresists, where the exposed regions are selectively removed during development, or negative tone photoresists, where the exposed regions remain after development, by proper selection of a development process or solvent. It is believed that exposure of organotin materials to UV or EUV radiation and subsequent processing results in the cleavage of the Sn—C bond and the formation of condensed network comprising Sn—O—Sn and Sn—OH bonds in the exposed area. The increased concentration of these bonds results in a more condensed and hydrophilic material relative to the starting material, and therefore creates large chemical and development contrasts between the exposed and the unexposed regions.

Radiation-sensitive organotin compositions that are useful as high-resolution and high-sensitivity photoresists have been described by Meyers et. al in U.S. Pat. No. 9,310,684, entitled "Organometallic Solution Based High Resolution Patterning Compositions", and in U.S. Pat. No. 10,228,618 (hereinafter the '618 patent) entitled "Organotin oxide hydroxide patterning compositions, precursors, and patterning", both of which are incorporated herein by reference. In general, the radiation sensitive organotin compositions comprise organic ligands bound to the Sn atoms via Sn—C and/or Sn-carboxylate bonds. The present disclosure describes new deuterium enriched organotin compositions that have been discovered that can exhibit improved patterning over non-enriched organotin compositions.

In some embodiments, the deuterium enriched organotin compositions can be represented by the formula $R_DSnL_3$, wherein $R_D$ is a hydrocarbyl group (alkyl, cycloalkyl, alkenyl, alkynyl, aryl) where at least 1 hydrogen atom is substituted with deuterium. In further embodiments, $R_D$ is a hydrocarbyl group where all hydrogen ($^1H$) atoms are substituted with deuterium ($^2H$). For example, $R_D$ can be —$CD_3$, —$CD(CD_3)_2$, or —$C(CD_3)_3C$, wherein D is deuterium and—is a bond to Sn. As described further below, the hydrocarbyl group can further comprise other heteroatoms. Applicant has developed multiple synthesis pathways for the deuterated organo tin compounds with hydrolysable ligands, and these are described in more detail below.

While not wanting to be limited by theory, substitution of deuterium atoms, such as $^2H$, into the radiation sensitive organotin compositions is thought to be advantageous due to the kinetic isotope effects of the heavy atoms. For example, some reaction pathways involving $^2H$ tend to be less kinetically favored than reaction pathways involving $^1H$. Therefore, it can be desirable for a radiation sensitive organotin composition to comprise $^2H$ atoms substituted for $^1H$ atoms to modify reaction-based pathways and processes, for example, thermolysis of Sn—C bonds, sensitivity to out-of-band radiation and/or photon shot noise, defect formation, etch rates, and/or scumming, which refers to residue left after patterning. In the examples below, EUV exposure of $^2H$-enriched organotin photoresist is shown.

Deuterium enriched materials may also be useful for myriad analytical techniques, particularly techniques that discriminate based upon mass or nucleus spin, e.g, chromatography, infrared spectroscopy, mass spectrometry, nuclear magnetic resonance, and the like. Those of ordinary skill in the arts will recognize the analytical advantages of deuterium enriched materials with respect to non-deuterated analogues.

The compositions described herein are useful as precursors for forming radiation patternable coatings, as well as for converting the precursors into other useful compositions, such as compositions with different hydrolysable ligands or cluster-like compositions having Sn—O—Sn bonds and/or Sn—OH groups. As described above, the photosensitivity of organotin materials arises from the character of the Sn—C bond and it is therefore generally desirable for the Sn—C bond to remain intact during processing from precursor to coating. The hydrolysable ligands have little effect on photosensitivity since they are generally hydrolyzed prior to irradiation, and are generally selected for desired processing, such as further purification, mode of deposition, stability, handling, and so on.

As described herein, the hydrolysable ligand is a ligand that promotes reaction of water with an organotin molecule to produce an organotin oxide hydroxide composition illustrated by the following reaction:

$$RSnL_3 + 2\ H_2O \rightarrow RSnOOH + 3\ HL. \quad (1)$$

For the purposes of the disclosure, the above reaction, and subsequent discussion, R and $R_D$ are taken to be interchangeable. The RSnOOH composition is generally used for the radiation patterning, which implies the hydrolysable ligands, L, have been removed by hydrolysis during processing. Some examples of suitable hydrolysable ligands are —NR'$_2$, —OR', —R'COO$^-$, and —CC(R') wherein R' is a silyl group or an hydrocarbyl group having no more than 30 carbon atoms, for example methyl, ethyl, n-propyl, isopropyl, n-butyl, iso-butyl, tert-butyl, tert-amyl, —(Si(CH$_3$)$_3$), —Ph (C$_6$H$_5$) and the like.

Hydrolysis of the $RSnL_3$ composition above generally yields hydroxide and oxide rich products where two or more RSn moieties are condensed to form Sn—O and Sn—OH bonds, for example the well-known "football" cluster $[(RSn)_{12}O_{14}(OH)_6](OH)_2$. As described below, hydrolysis of the instant $RSnL_3$ compositions can be used to prepare radiation patternable coatings.

In a coating, the RSnOOH composition is believed to generally form an oxo/hydroxo network with both Sn—OH and Sn—O—Sn moieties. For formation of radiation patternable coatings, the hydrolysis can take place during or after coating formation, but generally prior to irradiation. The coatings can be deposited using solution or vapor approaches.

R forms a carbon-tin bond wherein the carbon bound to the tin is $sp^3$ or $sp^2$ hybridized, and R comprises at least one deuterium atom and can comprise optionally unsaturated or aromatic carbon-carbon moieties and/or other heteroatoms, which are not carbon or hydrogen/deuterium. As noted above, for convenience as well as consistency in the art, R can be interchangeably referred to as an alkyl ligand, organo ligand or hydrocarbyl ligand, with the corresponding substituents and bonding structures.

In some embodiments, hydrocarbyl R ligands can be desirable for some patterning compositions where the compound (following hydrolysis of hydrolysable ligands) can be represented generally as $R^1R^2R^3CSn\ O_{(2-(z/2)-(x/2))}(OH)_2$, where $R^1$, $R^2$ and $R^3$ are independently hydrogen/deuterium or a hydrocarbyl group with 1-10 carbon atoms, in which $R^1$, $R^2$ and $R^3$ comprise collectively at least one deuterium atom. In some embodiments, it can be desirable to have R perdeuterated, i.e., that all hydrogen atoms are replaced by deuterium, while in other embodiments, only a fraction of the hydrogen atoms are replaced by deuterium. This representation of hydrocarbyl ligand R is similarly applicable to the other embodiments generally with $R^1R^2R^3CSn(L)_3$, with L corresponding to hydrolysable ligands, such as alkoxide (hydrocarbyl oxide), carboxylate, acetylide or amide moieties. In some embodiments, $R^2$ and $R^3$ can form a cyclic alkyl moiety, and $R^1$ may also join the other groups in a cyclic moiety. Suitable branched alkyl ligands can be, for example, isopropyl ($R^1$ and $R^2$ are methyl and $R^3$ is hydrogen or deuterium), tert-butyl ($R^1$, $R^2$ and $R^3$ are methyl), tert-amyl ($R^1$ and $R^2$ are methyl and $R^3$ is —CH$_2$CH$_3$), sec-butyl ($R^1$ is methyl, $R^2$ is —CH$_2$CH$_3$, and $R^3$ is hydrogen or deuterium), neopentyl ($R^1$ and $R^2$ are hydrogen or deuterium, and $R^3$ is —C(CH$_3$)$_3$), cyclohexyl, cyclopentyl, cyclobutyl, and cyclopropyl. One or more hydrogen atoms in these branched alkyl ligands can be replaced with deuterium. In other embodiments, hydrocarbyl groups may include aryl or alkenyl groups, for example, benzyl or allyl, or alkynyl groups. In further embodiments, suitable R groups may include hydrocarbyl groups substituted with hetero-atom functional groups including cyano, thio, ether, keto, ester, or halogenated groups or combinations thereof. As is conventional in this art, the hydrocarbyl group can be referred to as an alkyl group even though the group can have unsaturated bonds, aryl groups, heteroatoms, and so forth. In some embodiments, all hydrogen atoms can be replaced by deuterium to form perdeuterated groups.

For use in solution-deposited patterning compositions, it can be desirable to convert a product with trialkamide, triacetylide or other hydrolysable ligands to an organo tin trialkoxide, As described further below, this reaction is generally performed following purification with distillation through a reaction with a corresponding alcohol, although the reaction with alcohol can be performed without first purifying the trialkylamide/trialkylacetylide reactant. An additional solvent besides the alcohol may or may not be used. The product organo tin trialkoxide generally is an oil or low-melting point solid that can be purified through distillation. These steps are described further below and are outlined in the following Examples for a particular product. Conversion of the precursor compositions to trialkoxides is not required to form a coating precursor, but organotin trialkoxides can be convenient precursors for deposition because of the benign volatile products, e.g., alcohols, after hydrolysis and coating formation.

After preparation of the desired organotin precursor, the precursor can be dissolved in an appropriate solvent to prepare a precursor solution, such as an organic solvent, e.g., alcohols, aromatic and aliphatic hydrocarbons, esters or combinations thereof. In particular, suitable solvents include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-pentanol, 1-butanol, methanol, isopropyl alcohol, 1-propanol), ketones (e.g., methyl ethyl ketone), mixtures thereof, and the like. In general, organic solvent selection can be influenced by solubility parameters, volatility, flammability, toxicity, viscosity and potential chemical interactions with other processing materials. After the components of the solution are dissolved and combined, the character of the species may change as a result of partial in-situ hydrolysis, hydration, and/or condensation.

The organotin precursors can be dissolved in the solvent to afford concentrations of Sn suitable for forming coatings of appropriate thickness for processing. The concentrations of the species in the precursor solutions can be selected to achieve desired physical properties of the solution. In particular, lower concentrations overall can result in desirable properties of the solution for certain coating approaches, such as spin coating, that can achieve thinner coatings using reasonable coating parameters. It can be desirable to use thinner coatings to achieve ultrafine patterning as well as to reduce material costs. In general, the concentration can be selected to be appropriate for the selected coating approach. Coating properties are described further below. In general, tin concentrations comprise from about 0.005 M to about 1.4 M, in further embodiments from about 0.02 M to about 1.2 M, and in additional embodiments from about 0.1 M to about 1.0 M. A person of ordinary skill in the art will recognize that additional ranges of tin concentrations within the explicit ranges above are contemplated and are within the present disclosure.

In some embodiments, improved photosensitive precursor compositions can be present in a blended solution with one or more organotin compositions, such as $R_nSnX_{4-n}$ and its hydrolysates, where R is chosen from the various moieties described in detail herein and elaborated on explicitly above. Such blended solutions can be tuned for optimization of various performance considerations, such as solution stability, coating uniformity, and patterning performance. Blended compositions can be achieved by combing two or more organotin compositions, such as $R_nSnL_{4-n}$, where L is a hydrolysable ligand, with or without a solvent. For example, neat $RSnL_3$ can be combined with neat $R'SnL_3$ to form a blended precursor. The blended composition can then be diluted into a solvent, if desired. Alternatively, each individual organotin composition can be diluted into a desired solvent to form a distinct organotin solution, and then each individual organotin solution can then be combined to form a blended solution. In general, the hydrolysable ligand can be the same or different for each individual organotin component of the overall blended composition. In some embodiments, the improved photosensitive composition can comprise at least 1% by mol. Sn of a desired component in the blended solution, in further embodiments at least 10% by mol. Sn of the blended solution, in further embodiments at least 20% by mol. Sn of the blended solution, and in further embodiments at least 50% by mol. Sn of a specific desired component of the blended solution. Additional ranges of mol % of the improved photosensitive composition within the explicit ranges of the blended solution are contemplated and within the present disclosure.

Owing generally to their high vapor pressures, the organotin compositions described herein can be useful as precursors for forming coatings via vapor deposition. Vapor deposition methods generally include chemical vapor deposition (CVD), physical vapor deposition (PVD), atomic layer deposition (ALD), and modifications thereof. In a typical vapor deposition process, the organotin composition can be reacted with small molecule gas-phase reagents such as $H_2O$, $O_2$, $H_2O_2$, $O_3$, $CH_3OH$, HCOOH, $CH_3COOH$, and the like, which serve as O and H sources for production of radiation sensitive organotin oxide and oxide hydroxide coatings. Organotin compositions with alkylamides or alkoxides as hydrolysable ligands can be particularly desirable for use in vapor deposition techniques to form organotin oxide/hydroxide coatings. Vapor deposition of radiation patternable organotin coatings has been described by Wu et. al in published PCT Application WO 2019/217749, entitled "Methods for Making EUV Patternable Hard Masks", incorporated herein by reference, as well as in the '618 patent cited above. Production of radiation sensitive organotin coatings can generally be achieved by reacting the volatile organotin precursor $RSnL_3$ with a small gas-phase molecule. The reactions can include hydrolysis/condensation of the organotin precursor to hydrolyze the hydrolysable ligands while leaving the Sn—C bonds substantially intact.

With respect to an outline of a representative process for a radiation based patterning, e.g., an extreme ultraviolet (EUV) lithographic process, photoresist material is deposited or coated as a thin film on a substrate, pre-exposure baked, exposed with a pattern of radiation to create a latent image, post-exposure baked, and then developed with a liquid, typically an organic solvent, or with a dry development technique, to produce a developed pattern of the resist. Fewer steps can be used if desired, and additional steps can be used to remove residue to improve pattern fidelity.

The thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure. Coating thickness for radiation patternable coatings prepared by vapor deposition techniques can generally be controlled through appropriate selection of reaction time or cycles of the process.

The substrate generally presents a surface onto which the coating material can be deposited, and it may comprise a plurality of layers in which the surface relates to an upper most layer. The substrate is not particularly limited and can comprise any reasonable material such as silicon, silica, other inorganic materials, such as ceramics, and polymer materials.

After deposition and formation of the radiation patternable coating, further processing can be employed prior to exposure with radiation. In some embodiments, the coating can be heated from between 30° C. and 300° C., in further embodiments from between 50° C. and 200° C., and in further embodiments from between 80° C. and 150° C. The heating can be performed, in some embodiments for about 10 seconds to about 10 minutes, in further embodiments from about 30 seconds to about 5 minutes, and in further embodiments from about 45 seconds to about 2 minutes. Additional ranges for temperatures and heating durations within the above explicit ranges are anticipated and envisioned.

Synthesis of Deuterium Enriched Composition

Applicant has developed several suitable synthesis techniques suitable for synthesizing heavy-atom (deuterium) enriched organotin compositions. Selection of the technique can be based on practical aspects, such as purities obtained by different routes, yields, convenience of the procedures and availability of convenient starting materials. For example, desirable results for general synthesis of monoalkyltin trialkylamides have been achieved in which the alkylating agent may be a Grignard reagent, a diorganozinc reagent, or a mono-organozinc amide. These syntheses can directly produce the monoalkyl tin triamides with low polyalkyl contaminants that can be used for forming resists or that can be further purified to reduce the contaminant levels even further. In a further method developed by Applicant, the alkylating agent is an alkyl halide that reacts with a tin composition complexed with an alkali, alkaline, and/or pseudo-alkaline metal ion.

The synthesis of deuterated tin compositions is exemplified below. In one approach, the alkylating agent is a Grignard reagent. A Grignard reagent can be an organomagnesium halide. Specifically, a Grignard reagent in the described reaction may be RMgX, where X is a halide, generally Cl, Br, or I, and R is specified above. Grignard reagents are available commercially or can be synthesized using known methods. Commercial sources include American Elements Company, Sigma-Aldrich, and many other suppliers.

In the Grignard reactant approach, the alkylating agent selectively replaces an amide group of tin tetraamide with the alkyl group according to the following reaction.

$$RMgX + Sn(NR'_2)_4 \rightarrow RSn(NR'_2)_3 + \text{byproducts}, \quad (2)$$

where R and R' are as specified above. Similarly, tin tetracarboxylates and tin tetraalkoxides can be used as reactants for the formation of monoalkyltin carboxylates and monoalkyltin alkoxides, respectively, according to the following reactions:

$$RMgX + Sn(R'COO)_4 \rightarrow RSn(R'COO)_3 + \text{byproducts}, \quad (3)$$

$$RMgX + Sn(OR')_4 \rightarrow RSn(OR')_3 + \text{byproducts}, \quad (4)$$

$$RMgX + Sn(CCR')_4 \rightarrow RSn(CCR')_3 + \text{byproducts}, \quad (5)$$

where R and R' are as specified above. In some embodiments, the Grignard reagent can be added in an approximate 1:1 molar ratio such that the reaction selectively produces monoalkyl tin triamide/tricarboxylate/trialkoxide with low polyalkyl tin contaminants. The synthesis methods described improve the selectivity and yield of monoalkyl tin triamides/tricarboxylates/trialkoxides by limiting the formation of dialkyl tin byproducts. The Grignard reactant approach can be especially useful for formation of secondary and tertiary Sn—C bonds, for example branched alkyl R groups. The monoalkyl tin triamides with low polyalkyl contaminants can be further processed to form monoalkyl tin trialkoxides with low polyalkyl contaminants. These improved synthesis techniques are described further in published U.S. patent application 2019/0315781 to Edson et al. (hereinafter the '781 application), entitled "Monoalkyl Tin Compounds With Low Polyalkyl Contamination, Their Compositions and Methods," incorporated herein by reference.

With respect to the direct synthesis using deuterated organohalides, the enriched compositions can be synthesized through a reaction represented by the following overall reactions:

$$3\ HNR'_2 + 3\ MR'' (+ M'Z) + SnX_2 + RX' \rightarrow RSn(NR'_2)_3 + \text{byproducts, or} \quad (6)$$

$$3\ R'CCH + 3\ MR'' (+ M'Z) + SnX_2 + RX' \rightarrow RSn(CCR')_3 + \text{byproducts}, \quad (7)$$

wherein X and X' are independently a halide, and R" generally is a hydrocarbyl group with ≤10 carbon atoms. R" becomes incorporated into a by-product, generally HR", so its identity is generally not particularly limited or significant, and it can be selected for general availability, low cost, ease of removal of the by-product, and good reactivity. Some suitable examples of R" are n-butyl and tert-butyl. The R' groups provide the substituents for the corresponding hydrolysable ligands of the product compositions. In these reactions, M generally is lithium, but lithium can be replaced with other alkali metals, i.e., sodium, potassium, rubidium and cesium. The parenthetical M'Z represents optional reactants M"OR" or M"'$X_2$, where M" is an alkali metal ion, OR" is an alkoxide that remains passive, and M" is an alkaline earth/pseudo-alkaline earth metal ion provides as the halide with X being a halide ion. The RX compounds are selected to provide the desired organo ligands for the mono-organo tin products. As described in the Examples below and in the discussion above, specific examples of R include deuterated hydrocarbons, e.g. $—CD_3$ (d3-methyl), $—C(CD_3)_3$, (d9-tBu), and $—CD(CD_3)_2$ (d7-iPr). The wide availability of RX compounds as reactants as well as the broad reactivity of the compounds in the corresponding reactions provides an ability to introduce a wide range of organo ligands into the product mono-organo tin products. These reactions are described further in co-pending U.S. patent application Ser. No. 17/410,316 Edson et. al, entitled "Methods To Produce Organotin Compositions With Convenient Ligand Providing Reactants", incorporated herein by reference.

Presently, the isolation of the alkali metal tin triamides or alkali metal tin triacetylides have not been accomplished. The improved synthesis techniques are not contingent on the precise identity of the intermediates, and the general discussion herein focuses on the overall starting materials and the ultimate products that can be isolated and characterized. Nevertheless, the postulated identity of the intermediates, such as the $KSn(TMSA)_3$, is based on strong suppositions that follow from the species present. In the particular solvents used, metal ions are not expected to be well solvated. Yet, the compositions remain in solution, so large cluster formation and gelation is not observed. While not wanting to be limited by theory, organometallic reagents, for example alkyllithium, alkylmagnesium (Grignard reagent), and potassium tert-butoxide are known to form clusters, such as tetramers, hexamers, and cubanes, having metal-metal bonds, and it is therefore reasonable that similar species are formed in solution in possibly complex equilibrium mixtures that so far defy characterization. The relative stabilities of the known species then suggests what intermediate species can be expected to be present, but the precise structural characterization is not needed to understand their basic chemical involvement in the reactions. The reactivity of species would be consistent with the inability to remove the solvent to isolate the species.

While the overall reactions are presented above, these reactions can be performed in multiple steps. Since one of the reactants is tin dihalide, such as tin dichloride, a consideration for solvent selection can involve appropriate solubility of tin dihalide. The other initial reactants such as the dihydrocarbyl amine and the monoalkyl lithium (or generally the monoalkyl alkali metal), can be soluble in different solvents. In some embodiments, the reactants can be initially in slurry form if the reactants are partially soluble. The reactions are generally performed in dry organic solvents under an oxygen free or depleted atmosphere, such as a nitrogen purged atmosphere, argon or other inert atmosphere. Solvents can be selected to result in the solubility of the various components. Due to interactions of the solvent with the metal ions, selection of solvents can be based at least in part on reaction rates in the selected solvents, which can be evaluated empirically. If different solvents are selected, they are generally miscible. Aprotic polar solvents are generally useful, such as ethers (for example, dimethyl ether, diethyl ether), tetrahydrofuran (THF), acetone and mixtures thereof. The solvents should generally be selected to be inert with respect to the reactants, intermediates and products. If multiple solvents are used, for example to introduce distinct reactants, the solvents should generally be miscible with respect to each other. The first reaction can be considered the synthesis of a $MSnL_3$ intermediate, where L is dialkyl amide (dihydrocarbylamide) or alkyl acetylide (hydrocarbyl acetylide), although the particular structure has not been verified. From the reactants and reaction conditions, evidence does suggest formation of tin-ligand bonds, so the presence of the moiety $SnL_3$ seems likely, and the metal cations seem likely to be associated with the tin moieties for stabilization, but the particular structures may be present in complex equilibrium mixtures. This first reaction can be considered two separate reactions, if desired, with a first subreaction ($MR+HL \rightarrow ML+HR$) directed to the formation of a metal ligand composition (ML) and the subsequent subreaction with $SnCl_2$ or other tin dihalide ($3ML\ (+M'OR')+SnX_2 \rightarrow (MSnL_3)$+byproducts, where M'OP' is optional and the structure of $MSnL_3$ has not been formally determined). As described in detail, M can be an alkali metal, and alkaline earth metal and/or a pseudo-alkaline earth metal. In general, for the first reaction, the solutions are cooled, in some embodiments to less than 10° C. and in further embodiments 0° C., which can be a convenient temperature for use of an ice bath, although for non-aqueous solutions there is nothing special about this temperature. Cooling to lower temperatures can be used, and the temperature may not be kept for the entire reaction time. Cooling allows for desired control of the reaction while maintaining reasonable reaction rates. The first subreaction can be performed for as long as is practical and is not particularly limited. The first subreaction can be allowed to continue for at least about 30 seconds, in other embodiments at least about 2 minutes, in some embodiments 1 minute to 5 hours and in some embodiments from about two minutes to about 3 hours. In some embodiments, the two subreactions can be combined and proceed essentially as a single reaction, which is effectively zero time for the first subreaction or short times for the first subreaction. If a non-lithium alkali metal alkoxide and/or an alkaline earth (or pseudo-alkaline earth) dihalide is introduced as a reactant, this compound can be added conceptually as part of the first subreaction or the second subreaction or potentially in the context of a third subreaction between the first subreaction and the second subreaction. A person of ordinary skill in the art will recognize that additional ranges of time and temperature within the explicit ranges above are contemplated and are within the present disclosure.

Generally, the alkyl alkali metal (e.g., lithium) reactant and the amine/acetylene reactant are in rough stoichiometric amounts, although generally a small to moderate excess of the amine/acetylene reactant is used, such as from about 1 mole percent (mol %) to about 50 mol % amine/acetylene reactant can be used. Similar stoichiometric amounts or ligand precursors (dialkylamine or alkylacetylene) can be used if a non-lithium alkyl alkali metal compound is used. Generally, it is desirable to have ML compositions in a 3:1 ratio relative to the molar amount of Sn to add three ligands for each tin. If a non-lithium metal alkoxy alkali metal compound is used along with alkyl lithium, the alkyl lithium can have an amount based on molar equivalents for the amine/acetylene reactant, while the non-alkali metal compound can have a molar amount equivalent to the tin compound to be added, although greater amounts of the metal (alkali metal or alkaline earth metal or pseudo-alkaline earth metal) can be used if desired, as long as additional amounts of ML are not formed. The tin reactant can be added, for corresponding embodiments, in an approximate molar equivalent (1:3) for the ML ligand contributing reactant to form three ligand tin bonds for each tin atom. The low amounts of contaminants from tin byproducts with 1, 2 or 4 ligands confirms the effectiveness of controlling the molar ratios of tin to ML reactants. The metal concentrations in the reactant solutions are generally from about 0.025 M to about 2 M, and in further embodiments from about 0.5 to about 1.5 M. A person of ordinary skill in the art will recognize that concentration range and allowed stoichiometric ratios within the explicit ranges above are contemplated and are within the present disclosure.

The second reaction involves the introduction of a carbon-tin bond along with the formation of the organo ligand bound to the tin. The carbon-tin bond conceptually replaces a metal-tin bond, the metal being an alkali metal, alkaline earth metal, and/or pseudo-alkaline earth metal. The organo ligand to be bonded to the tin results from a reaction with an organohalide, RX. Generally, at least about a stoichiometric amount of organohalide is introduced for forming the carbon-tin bond, but an excess of the organohalide can be introduced. In some embodiments, up to a three-fold molar excess of the organohalide can be used in the reaction and in further embodiments from about 1 to about 2 molar equivalents of RX relative to moles of Sn can be used. The solvents can be the same or selected from the same available solvents and mixtures thereof as used for the first reaction. The products of the first reaction are generally not purified prior to performing the second reaction, although byproducts could be removed if convenient. The metal concentrations generally are similar to the concentrations of the first reaction step, although usually slightly smaller due to dilution. To account for the exothermic nature of the reaction, the second reaction can be generally, but not necessarily, started at a low temperature, such as about 0° C. or more generally about −78.5° C. to about 10° C., although in some embodiments, the reactants can be combined at room temperature. After mixing the reactants for the second reaction, the reaction can be allowed to continue at the same temperature or allowed to gradually warm to a temperature from about 20° C. to about 50° C. or room temperature (20-24° C.). The reaction can run for at least about 15 minutes, in some embodiments from about 15 minutes to about 24 hours, and in some embodiments from about 30 minutes to about 15 hours, although longer reaction times can be used, if desired. A person of ordinary skill in the art will recognize that additional ranges of concentration, molar ratios, temperatures and times give above for the second reaction are contemplated and are within the present disclosure.

Due to the exothermic nature of the reactions described herein, it can be beneficial to modify various parameters of the synthesis such as amounts of reactants, reaction temperatures, reagent addition times, reaction times, and the like. Such considerations are known by those of ordinary skill in the art. A useful analytical technique for analyzing the reactions and informing practitioners of suitable process conditions is reaction calorimetry. Calorimetric data can provide useful thermodynamic variables for a given reaction. In particular, scale-dependent variables (e.g., heats of enthalpy) can be measured for a desired reaction and used to properly conduct the reaction at larger scale. In this way, process variables can be suitably controlled for reactions at different scales. Reaction calorimetric data is included in some examples in the '316 application. Within the guidelines presented above along with the guidance of the examples blow, a person of ordinary skill in the art will recognize that specific parameters for a particular reaction can be adjusted to provide desired results. Optimization using routine experimentation can be performed by a person of ordinary skill based on these teachings for a wide range of product compositions. The reactions exemplified result in good yields and a high specificity for the product compositions.

Once the product is formed, the organo tin tri(dihydrocarbylamides/hydrocarbyl acetylides) can be purified. The purification depends on the nature of the product, but generally involves the separation of the desired product from by products and potentially any unreacted reagents. Purification can also comprise removal of any volatile compounds including solvents from the product mixture by drying or exposure to vacuum. For products with significant vapor pressures, it can be desirable to purify the product through vacuum distillation or, if desired, fractional distillation designed to achieve high purity. See published U.S. patent application 2020/0241413 to Clark et al., entitled "Monoalkyl Tin Trialkoxides and/or Monoalkyl Tin Triamides With Low Metal Contamination and/or Particulate Contamination and Corresponding Methods," incorporated herein by reference.

Products, with or without first being purified, can be also reacted to form derivatives, such as organo tin trialkoxides, which can be further purified by the techniques above and other means known in the art. After preparation of trialkoxide composition, further purification of the composition can be performed if desired. In some embodiments, fractional distillation methods can be used as described by Edson et al in U.S. Pat. No. 10,787,466, entitled "Monoalkyl tin compounds with low polyalkyl contamination, their compositions and methods", incorporated herein by reference.

In some embodiments, the hydrolysable ligand for the photopatternable precursor composition is an alkoxide. Alkoxides are particularly suitable as hydrolysable ligands for processing of oxide hydroxide coatings, for either solution processing or vapor processing, due to their shelf stability, hydrolytic susceptibility, and the relatively benign hydrolyzed products, e.g. alcohols, as well as vapor pressure for vapor deposition. Conversion of organotin amides and acetylides into organotin alkoxides can generally be achieved via alcholysis as described by the following reactions:

$$RSn(NR'_2)_3 + 3\ R''OH \rightarrow RSn(OR'')_3 + 3HNR'_2, \text{ or}$$

$$RSn(CCR')_3 + 3\ R''OH \rightarrow RSn(OR'')_3 + 3HCCR',$$

wherein R' and R" are the same or different and are generally alkyl groups with ≤10 carbon atoms. Particularly suitable R' and R" groups are methyl, ethyl, propyl, butyl, pentyl (amyl), and, when applicable, their respective isomers, such as tert-amyl.

In some embodiments, the photosensitive composition can be diluted into a solvent to prepare an improved photoresist solution. Suitable solvents must of course include those that the improved photosensitive composition is suitably soluble in, but can be chosen based on their physical properties, such as flammability, viscosity, toxicity, volatility, and such. Other considerations for suitable solvents could be cost and potential interactions with other processing materials. Some examples of suitable solvents include alcohols (e.g., 4-methyl-2-pentanol, 1-butanol, cyclohexanol), esters (e.g., ethyl acetate, propylene glycol monomethyl ether acetate, ethyl lactate), ethers (e.g., propylene glycol monomethyl ether), ketones (e.g., 2-heptanone, cyclopentanone, cyclohexanone, 1-butanone, 4-methyl-2-pentanone), mixtures thereof, and the like. One of ordinary skill in the art will understand that other suitable solvents not explicitly listed are envisioned. The improved photoresist solutions can be used to form radiation patternable coatings as described below.

In some embodiments, the heavy atom enriched photosensitive compositions can be partially or fully hydrolyzed prior to dissolution in a suitable solvent as described above. In such hydrolyzed compositions, the hydrolysable ligands of the heavy atom enriched photosensitive composition are partially or fully replaced by O or OH ligands in condensed clusters comprising Sn—C bonds, and Sn—O and/or Sn—OH bonds.

In some embodiments, the deuterium enriched photosensitive compositions can be present in a blended solution with one or more other monoalkyl tin compounds with a different R group, and/or other organotin compositions, such as $R_nSnL_{4-n}$ and its hydrolysates, where n is 2, 3 or 4, and R is as specified above. Such blended solutions can be tuned for optimization of various performance considerations, such as solution stability, coating uniformity, and patterning performance. Blended compositions can be achieved by combing two or more organotin compositions, such as $R_nSnL_{4-n}$, where L is a hydrolysable ligand, with or without a solvent. For example, neat $RSnL_3$ can be combined with neat $R'SnL_3$ to form a blended precursor. The blended composition can then be diluted into a solvent, if desired. Alternatively, each individual organotin composition can be diluted into a desired solvent to form a distinct organotin solution, and then each individual organotin solution can then be combined to form a blended solution. In general, the hydrolysable ligand can be the same or different for each individual organotin component of the overall blended composition. In some embodiments, the deuterium enriched photosensitive composition can comprise at least 1% by mol. Sn of the blended solution, in further embodiments at least 10% by mol. Sn of the blended solution, in further embodiments at least 25% by mol. Sn of the blended solution, and in further embodiments at least 75% by mol. Sn of the blended solution. Additional ranges of mol % of the heavy atom enriched photosensitive composition within the explicit ranges of the blended solution are contemplated and within the present disclosure. In other embodiments, all of the tin compounds of the precursor solution, e.g., a blend, are deuterated, which involve a single composition or a blend of deuterated components.

The natural abundance of deuterium is about 0.016% of hydrogen. Thus, the deuterium enrichment refers to a greater than natural abundance, and the enrichment can be a majority of the hydrogens replaced by deuterium, for example, >99% deuterium enrichment. Also, deuteration can be relevant for all of the hydrogens of a ligand (perdeuterated) or deuteration can be site specific. While high perdeuterated enrichment (>99% by mole) can be desirable to increase the effects of deuteration, lesser amounts of deuteration are contemplated with respect to either site specific or lower degrees of deuteration. Generally, the extent of deuteration is at least about 50 mole % for a particular site or for perdeuteration. One of ordinary skill in the art will understand that some exchange of $^1H$ for $^2H$ and vice versa during handling, processing, and storage can take place with the likelihood depending on the composition of the ligand. For example, hydrolysis of the $RSnL_3$ compositions can result in the formation of both Sn—OD and Sn—OH bonds. For the purposes of this disclosure, the deuteration of hydrolyzed products is expected and is within the present disclosure.

Radiation Patternable Coatings

A radiation patternable coating can be formed through deposition and subsequent processing of the photosensitive compositions onto a selected substrate. Deposition of radiation patternable coatings can be achieved through various means known by those of ordinary skill in the art.

Deposition of the radiation-sensitive organotin compositions into radiation patternable coatings is generally achieved via hydrolysis and condensation processes. For example, solution deposition of radiation patternable organotin coatings has been described in the Meyers references above. Vapor deposition techniques that employ hydrolysis/condensation-based reactions have also been described by Wu et. al in published PCT Patent App. No. WO 2019/217749 entitled "Methods for Making EUV Patternable Hard Masks", incorporated by reference, as well as in the '618 patent cited above. In any case, the radiation-sensitive organotin compositions can be significantly converted into an organotin hydroxide oxide wherein the radiation sensitive organic ligands having Sn—C bonds to Sn atoms are incorporated into a loosely associated network of Sn—O—Sn and Sn—OH bonds. Owing to the incorporated organic ligands, the resulting coating can be considered hydrophobic.

If solution deposition is desired, a particularly useful solution deposition method is spin coating. Spin coating is well known in the art and can be particularly useful for photoresist processing in semiconductor manufacturing. In a typical spin coating method, the photoresist solution is delivered to the surface of a substrate, such as a Si wafer, and the substrate is rapidly rotated to form a coating. During the spin coating process, the hydrolysable ligands of the organotin composition can react with ambient water to undergo significant hydrolysis and condensation to result in the formation of a coating on the substrate that comprises a Sn—O—Sn and Sn—OH network along with the radiation sensitive Sn—C bonds. In some embodiments, the improved photoresist solutions are spin coated with a spin speed of between 500 and 3000 rpm. The rpm used is not particularly limited, but is generally tailored to yield a desired coating thickness. In general, slower spin speeds yield larger coating thicknesses than faster spin speeds for a given photoresist solution. Those of ordinary skill in the art will understand the relationship between spin speed and coating thickness.

Coating thickness can also depend on the concentration of Sn in the photoresist solution. In some embodiments the [Sn] concentration in a suitable solvent is from 0.005 to about 1.0 M, in further embodiments from about 0.01 M to about 0.5 M, and in further embodiments from about 0.05 M to about 0.1M. Those of ordinary skill in the art will understand that additional ranges of [Sn] concentration are contemplated and within the present disclosure.

The thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure.

In other embodiments, the radiation patternable coating can be formed through various vapor deposition methods, such as atomic layer deposition (ALD), chemical vapor deposition (CVD), physical vapor deposition (PVD), and the like. In a typical vapor deposition technique, generally one or more metal-containing precursors are reacted on or more with small molecule gas-phase reagents such as $H_2O$, $H_2O_2$, $O_3$, $O_2$, or $CH_3OH$, which serve as band H sources for production of oxides and oxide hydroxides. Thus, the hydrolysable compounds can be directly deposited via vapor phase hydrolysis as the corresponding alkyl tin oxide hydroxide coating, which can then be appropriately patterned.

In CVD methods, two or more reactant gases are generally mixed in the chamber in the vicinity of the substrate surface. Therefore, sufficient stability can be designed into the reaction conditions to control undesirable vapor-phase reactions and nucleation. ALD precursors, introduced separately and sequentially to the reaction chamber, typically react with chemisorbed co-precursor or decomposition products saturating the substrate surface. Desirable features of $RSnL_3$ precursors include, for example, sufficient volatility for vapor-phase transport in the system, thermal stability to prevent premature decomposition, and appropriate reactivity with co-precursors to produce the target product under prescribed process conditions. The pressure and temperature in the reaction chamber can be selected to control the reaction process.

Coating thickness for radiation patternable coatings prepared by vapor deposition techniques can generally be controlled through appropriate selection of reaction time or cycles of the process. The thickness of the radiation patternable coating can depend on the desired process. For use in single-patterning EUV lithography, coating thicknesses are generally chosen to yield patterns with low defectivity and reproducibility of the patterning. In some embodiments, suitable coating thickness can from between 0.5 nm and 100 nm, in further embodiments from about 1 nm to 50 nm, and in further embodiments from about 2 nm to 25 nm. Those of ordinary skill in the art will understand that additional ranges of coating thickness are contemplated and are within the present disclosure.

The substrate generally presents a surface onto which the coating material can be deposited, and it may comprise a plurality of layers in which the surface relates to an upper most layer. The substrate is not particularly limited and can comprise any reasonable material such as silicon, silica, other inorganic materials, such as ceramics, and polymer materials.

After deposition and formation of the radiation patternable coating, further processing can be employed prior to exposure with radiation. In some embodiments, the coating can be heated from between 30° C. and 300° C., in further embodiments from between 50° C. and 200° C., and in further embodiments from between 80° C. and 150° C. The heating can be performed, in some embodiments for about 10 seconds to about 10 minutes, in further embodiments from about 30 seconds to about 5 minutes, and in further embodiments from about 45 seconds to about 2 minutes. Additional ranges for temperatures and heating durations within the above explicit ranges are anticipated and envisioned.

Patterning of the Compositions:

Radiation generally can be directed to the coated substrate through a mask or a radiation beam can be controllably scanned across the substrate. In general, the radiation can comprise electromagnetic radiation, an electron-beam (beta radiation), or other suitable radiation. In general, electromagnetic radiation can have a desired wavelength or range of wavelengths, such as visible radiation, ultraviolet radiation, or X-ray radiation. The resolution achievable for the radiation pattern is generally dependent on the radiation wavelength, and a higher resolution pattern generally can be achieved with shorter wavelength radiation. Thus, it can be desirable to use ultraviolet light, X-ray radiation, or an electron-beam to achieve particularly high-resolution patterns.

Following International Standard ISO 21348 (2007) incorporated herein by reference, ultraviolet light extends between wavelengths of greater than or equal to 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light at 13.5 nm has been used for lithography, and this light is generated from a Xe or Sn plasma source excited using high energy lasers or discharge pulses. Soft x-rays can be defined from greater than or equal to 0.1 nm to 5 less than 10 nm.

The amount of electromagnetic radiation can be characterized by a fluence or dose which is obtained by the integrated radiative flux over the exposure time. In some embodiments, suitable radiation fluences can be from about 1 $mJ/cm^2$ to about 200 $mJ/cm^2$, in further embodiments from about 2 $mJ/cm^2$ to about 150 $mJ/cm^2$ and in further embodiments from about 3 $mJ/cm^2$ to about 100 $mJ/cm^2$. In an embodiment, the EUV radiation can be done at a dose of less than or equal to about 150 $mJ/cm^2$ or with an electron beam at a dose equivalent to or not exceeding about 2 $mC/cm^2$ at 30 kV. A person of ordinary skill in the art will recognize that additional ranges of radiation fluences within the explicit ranges above are contemplated and are within the present disclosure.

During exposure to radiation, such as ultraviolet (UV), extreme ultraviolet (EUV), and electron beams, and subsequent processing, the Sn—C and/or Sn-carboxylate bonds are cleaved to result in a more condensed and hydrophilic oxide hydroxide network. As the relative concentration of organic ligands in the exposed area decreases, the polarity of the exposed area increases and the hydrophilicity of the exposed area increases.

Based on the design of the coating material, there can be a large contrast of material properties between the irradiated regions that have condensed coating material and the unirradiated, coating material with substantially intact Sn—C bonds. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure. This high contrast in material properties further facilitates the formation of high-resolution lines with smooth edges in the pattern following development as described in the following section.

For the negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. In particular, suitable developers include, for example, alcohols (e.g., 4-methyl-2-pentanol, 1-butanol, isopropanol, 1-propanol, methanol), ethyl lactate, ethers (e.g., tetrahydrofuran, dioxane, anisole), ketones (pentanone, hexanone, 2-heptanone, octanone) and the like. The development can be performed for about 5 seconds to about 30 minutes, in further embodiments from about 8 seconds to about 15 minutes and in additional embodiments from about 10 seconds to about 10 minutes. A person of ordinary skill in the art will recognize that additional ranges within the explicit ranges above are contemplated and are within the present disclosure. In addition to the primary developer composition, the developer can comprise additional compositions to facilitate the development process. Suitable additives may include, for example, viscosity modifiers, solubilization aids, or other processing aides. If the optional additives are present, the developer can comprise no more than about 10 weight percent additive and in further embodiments no more than about 5 weight percent additive. A person of ordinary skill in the art will recognize that additional ranges of additive concentrations within the explicit ranges above are contemplated and are within the present disclosure. Developer blends and additives are described further in published U.S. patent application 2020/0326627 to Jiang et al., entitled "Organometallic Photoresist Developer Compositions and Processing Methods," incorporated herein by reference.

With a weaker developer, e.g., diluted organic developer or compositions in which the coating has a lower development rate, a higher temperature development process can be used to increase the rate of the process. With a stronger developer, the temperature of the development process can be lower to reduce the rate and/or control the kinetics of the development. In general, the temperature of the development can be adjusted between the appropriate values consistent with the volatility of the solvents. Additionally, developer with dissolved coating material near the developer-coating interface can be dispersed with ultrasonication during development. The developer can be applied to the patterned coating material using any reasonable approach. For example, the developer can be sprayed onto the patterned coating material. Also, spin coating can be used. For automated processing, a puddle method can be used involving the pouring of the developer onto the coating material in a stationary format. If desired spin rinsing and/or drying can be used to complete the development process. Suitable rinsing solutions include, for example, ultrapure water, aqueous tetraalkyl ammonium hydroxide, methyl alcohol, ethyl alcohol, propyl alcohol and combinations thereof. After the image is developed, the coating material is disposed on the substrate as a pattern.

In some embodiments, a solventless (dry) development process may be conducted through the use of an appropriate thermal development or plasma development process, such as those described by Tan et al. in published PCT Pat App. No: WO 2020/264158, entitled "Photoresist Development With Halide Chemistries", incorporated herein by reference. For organotin photoresist coatings, dry development can be conducted through the use of halogen-containing plasmas and gases, for example HBr and BC13. In some cases, dry development may offer advantages over wet development such as reduced pattern collapse, deceased scum, and fine control over developer compositions, i.e. the plasma and/or etch gases.

After completion of the development step, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, non-thermal treatments, including blanket UV exposure, or exposure to an oxidizing plasma such as 02 may also be employed for similar purposes.

In some embodiments, adjacent linear segments of neighboring structures can have an average pitch (half-pitch) of no more than about 60 nm (30 nm half-pitch), in some embodiments no more than about 50 nm (25 nm half-pitch) and in further embodiments no more than about 34 nm (17 nm half-pitch). Pitch can be evaluated by design and confirmed with scanning electron microscopy (SEM), such as with a top-down image. As used herein, pitch refers to the spatial period, or the center-to-center distances of repeating structural elements, and as generally used in the art a half-pitch is a half of the pitch. Feature dimensions of a pattern can also be described with respect to the average width of the feature, which is generally evaluated away from corners or the like. Also, features can refer to gaps between material elements and/or to material elements. In some embodiments, average widths can be no more than about 25 nm, in further embodiments no more than about 20 nm, and in additional embodiments no more than about 15 nm. A person of ordinary skill in the art will recognize that additional ranges of pitch and average widths within the explicit ranges above are contemplated and are within the present disclosure.

In some embodiments, average line-width roughness can be no more than about 5.5 nm, in some embodiments no more than about 5 nm and in further embodiments no more than about 4.5 nm. Evaluating line-width roughness is performed by analysis of top-down SEM images to derive a 3 σ deviation from the mean line-width. The mean contains both high-frequency and low-frequency roughness, i.e., short correlation lengths and long correlation lengths, respectively. The line-width roughness of organic resists is characterized primarily by long correlation lengths, while the present organometallic coating materials exhibit significantly shorter correlation lengths. In a pattern transfer process, short correlation roughness can be smoothed during the etching process, producing a much higher fidelity pattern. A person of ordinary skill in the art will recognize that additional ranges of line-width roughness within the explicit ranges above are contemplated and are within the present disclosure. A rinse can be performed to further remove some patterning defects and improve pattern fidelity, as described in published U.S. patent application 2020/0124970 to Kocsis et al., entitled "Patterned Organometallic Photoresists and Methods of Patterning," incorporated herein by reference.

EXAMPLES

Example 1

Figure 1B:
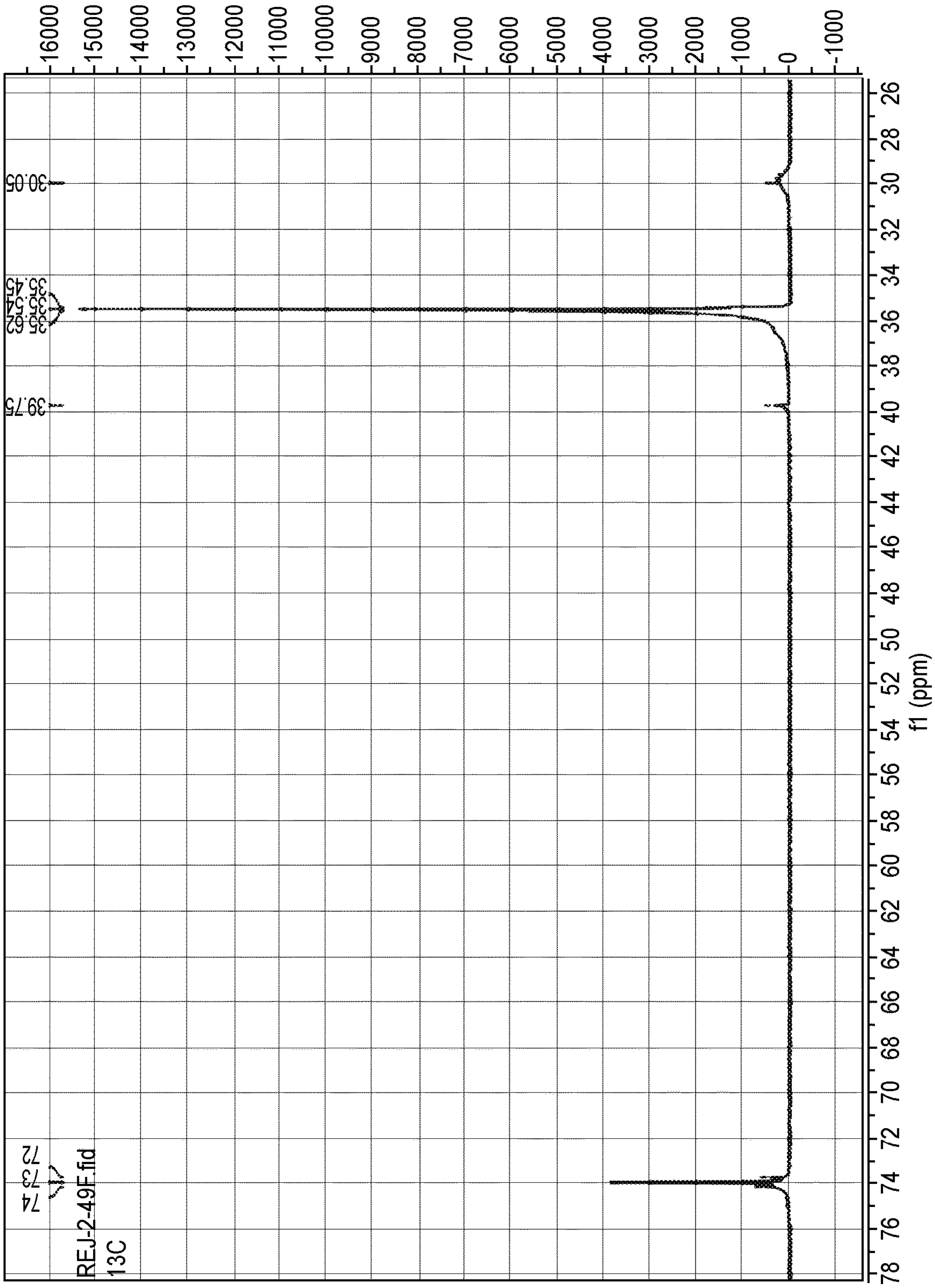
FIG. 1B is a $^{13}C$ NMR spectrum of d9-tBuSn(O-t-Bu)$_3$ in $C_6D_6$.
Figure 1C:
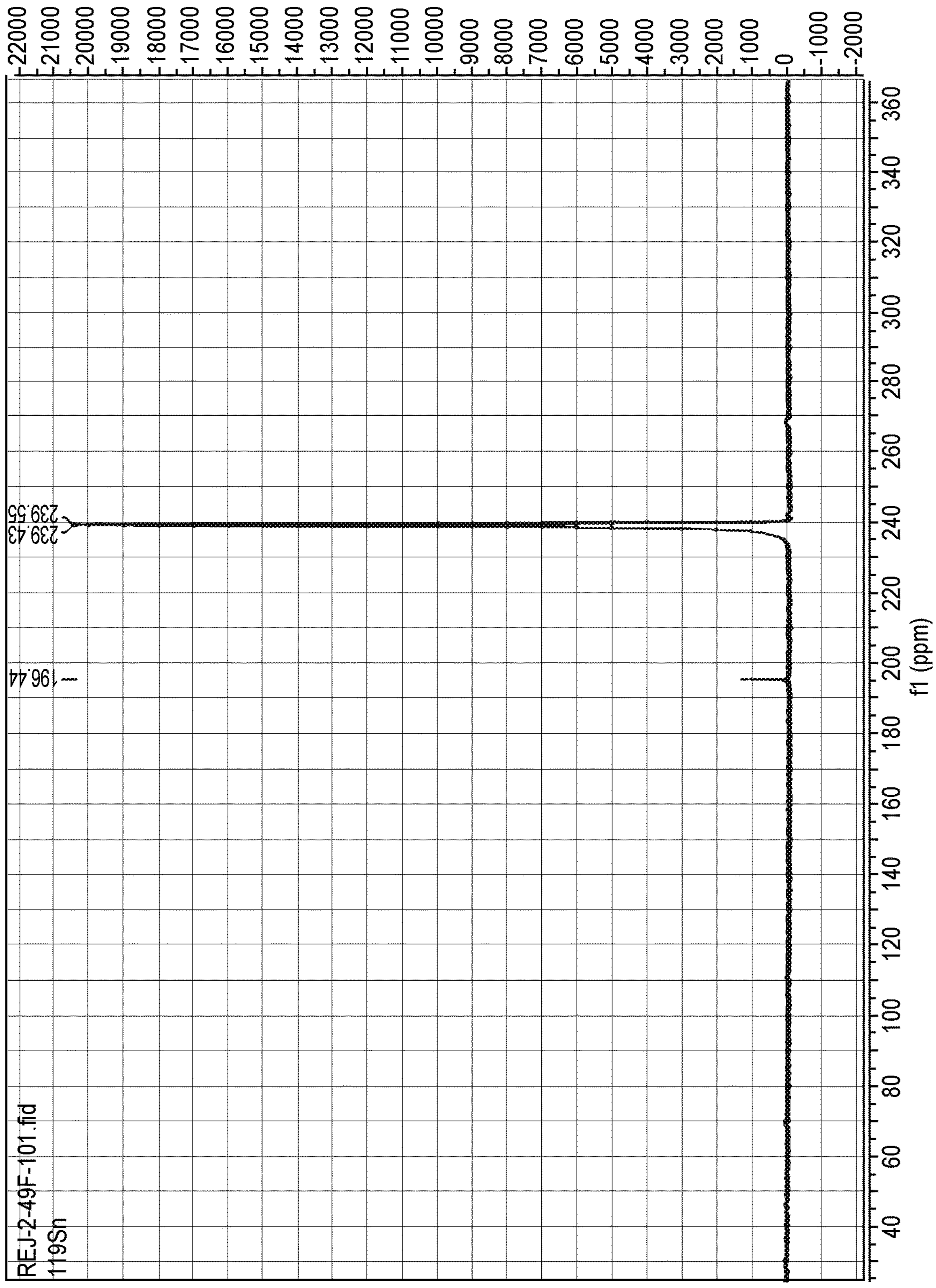
FIG. 1C is a $^{119}Sn$ NMR spectrum of d9-tBuSn(O-t-Bu)$_3$ in $C_6D_6$.

Preparation of nonadeutero-tert-butyltin tris(tert-butoxide) via Oxidative Stannylation This example deomstrates the synthesis if a deuterated monoalkyl tin trialkoxide using an oxidative stannylation reaction introducing the deuterated ligand as an alkyl halide. nButyllithium (1.03 mL, 2.53 mmol, 2.45 M in hexanes) was added to a cold solution (−50° C.) of diethylamine (0.262 g, 2.53 mmol) in diethyl ether (4 mL). After a few minutes, a slurry of tin(II) chloride (0.160 g, 0.845 mmol) and potassium tert-butoxide (0.095 g, 0.845 mmol) in THF (4 mL) was added. The contents were warmed to 0° C. and stirred for 2 h. The flask was re-cooled to −50° C. and a solution of nonadeutero-tert-butyl iodide in THF was added dropwise. After stirring for 16 h, tert-butanol (3.1 eq) was added. After 0.25 h, solvent was removed in vacuo and pentane was added. Salts were removed by filtration and pentane was removed in vacuo to yield nonadeutero-tert-butyltin tris(tert-butoxide) as a colorless liquid. The compound was further purified by fractional distillation, and $^{2}H$, $^{13}C$, and $^{119}Sn$ NMR spectra of d9-tBuSn(O-t-Bu)$_3$ in $C_6D_6$ were collected and shown in FIGS. 1A, 1B, and 1C, respectively.

Example 2

Preparation of nonadeutero-tert-butyltin tris(tert-butoxide) via Grignard Reaction Part 1. Synthesis of d9-t-BuSn(NMe$_2$)$_3$ A 5 L 3-neck round bottom flask was charged with Sn(NMe$_2$)$_4$ (827.5 g, 2805 mmol, Sigma) in an argon-filled glovebox. Anhydrous ether (2000 mL) was added to the flask. A quantity of deuterated t-BuMgCl (1500 mL, 2.06 M (freshly titrated), 3090 mmol) was added to a separate 2 L 2-neck round bottom flask. The flasks were stopped and attached to a Schlenk line. The Sn(NMe$_2$)$_4$ solution was transferred to a 5 L jacketed reactor and stirred at 240 RPM. An automated syringe pump was used to deliver the deuterated t-BuMgCl solution to the 5 L jacketed reactor at a rate of 50 ml $min^{-1}$. The temperature of the mixture in the jacketed reactor was maintained at 20° C. After complete addition of the d9-t-BuMgCl solution, the reaction was stirred overnight.

The resulting mixture was transferred through at 10 L filter reactor into a 5 L 3-neck round bottom flask equipped with a stir bar. The 5 L jacketed reactor and the solids in the filter reactor were rinsed with pentane (2×1 L). The washings were collected in the 5 L 3-neck round bottom flask equipped with a stir bar and the volatiles were removed under vacuum. After the volatiles were removed, a light yellow oily suspension corresponding to the crude product was observed. The flask was taken into a glovebox and the crude product was filtered through a course porosity fritted funnel. The filtrate was transferred into a 2 L 2-neck round bottom flask equipped with a stir bar, which was stoppered and transferred to a Schlenk line. The crude product was purified by short-path vacuum distillation into a 1 L receiving flask (500 mTorr, 65° C.-75° C.) to give 323-604 g, 37-70% of a colorless oil identified as d9-t-BuSn(NMe$_2$)$_3$.

Part 2. Synthesis of d9-t-BuSn(O-t-Bu) from d9-t-BuSn (NMe$_2$)$_3$ In a glovebox, a 2-L, 2-neck RBF was charged with ~500-mL pentane and d9-t-BuSn(NMe$_2$)$_3$ (329.4 g, 1.07 mol) from Part 1. The flask was tared on a balance, and tris(2-aminoethyl)amine (3.91 g, 26.7 mmol) was added via syringe directly into the reaction mixture. A magnetic stir bar was added, and the reaction was then sealed and brought to a Schlenk line. The flask was cooled in a dry ice/isopropanol bath. Separately, a 1-L Schlenk flask was charged with tert-butanol (292.2 g, 3.315 mols) and a small amount of pentane and then attached to the Schlenk line. The alcohol/pentane solution in the Schlenk flask was transferred via cannula to the reaction flask with an outlet purge to a mineral oil bubbler connected in line to an acid trap solution for the off-gassed $NMe_2H$. After complete addition of the alcohol, the reaction was allowed to come to room temperature and stirred for 1 hour. After 1 hour of reaction, the solvent was removed in vacuo, and the product was vacuum distilled (95-97° C., 500 mtorr) to yield 435 g (93%) of a colorless oil.

Example 3

Preparation of trideuteromethyltin tris(phenylacetylide) and trideuteromethyltin tris(tert-pentoxide)

Figure 2A:
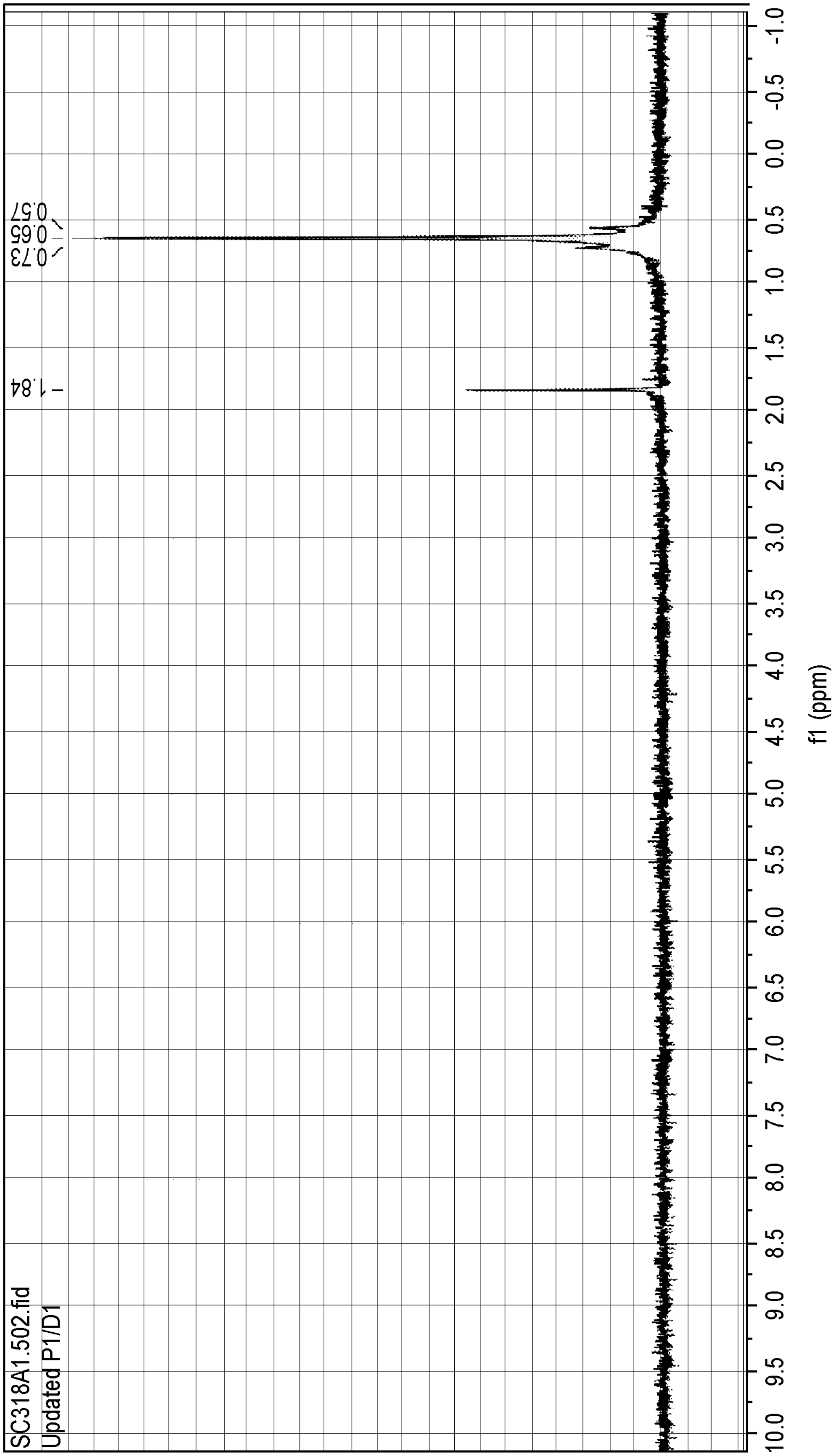
FIG. 2A is a $^2H$ NMR spectrum of $D_3MeSn(CCPh)_3$ in $C_6D_6$.
Figure 2B:
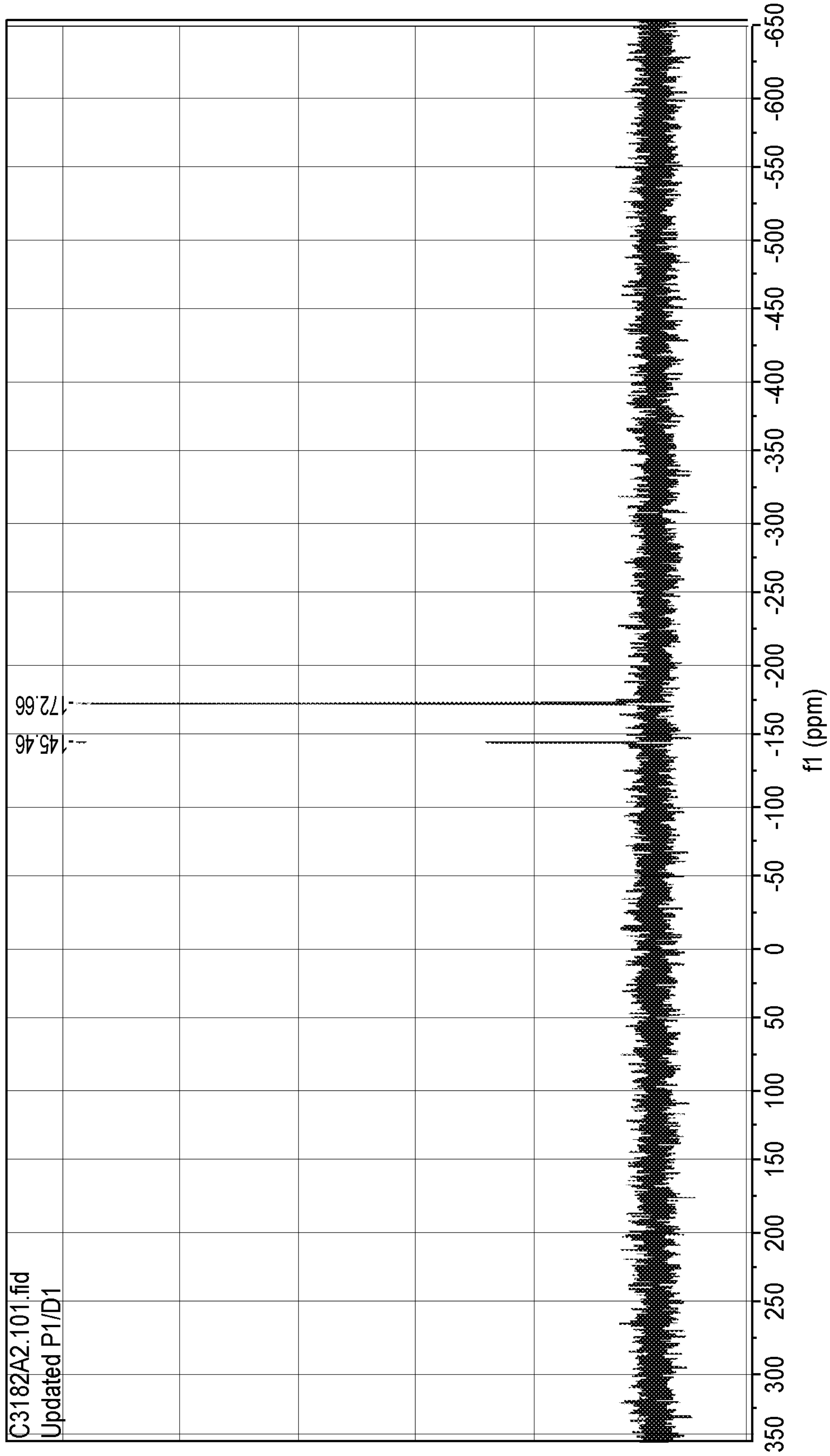
FIG. 2B is a $^{119}Sn$ NMR spectrum of $D_3MeSn(CCPh)_3$ in $C_6D_6$.

This example demonstrates the synthesis of a deuterated tin tris(phenylacetylide) and a corresponding trialkoxide.

nButyllithium (300 mmol/1.6 M in hexanes) was added to a cold solution (−78° C.) of diethylamine (350 mmols) in diethylether (500 mL). After a few minutes, tin(II) chloride (100 mmol in 100 mL tetrahydrofuran) was added dropwise. The contents were warmed to room temperature and stirred for 2 h. The flask was re-cooled to −78° C. and trideutero-iodomethane (120 mmol) was added. The resulting reaction mixture was allowed to warm to RT over 16 h at which time solvent was removed in vacuo. The contents were redissolved in diethylether and filtered over a silica plug. The volatiles were then removed to yield the crude product (a low melting point solid) d3-$MeSn(CCPh)_3$. $^2H$ and $^{119}NMR$ spectra were collected on the product in $C_6D_6$, and the spectra are shown in FIGS. 2A and 2B, respectively.

Figure 3A:
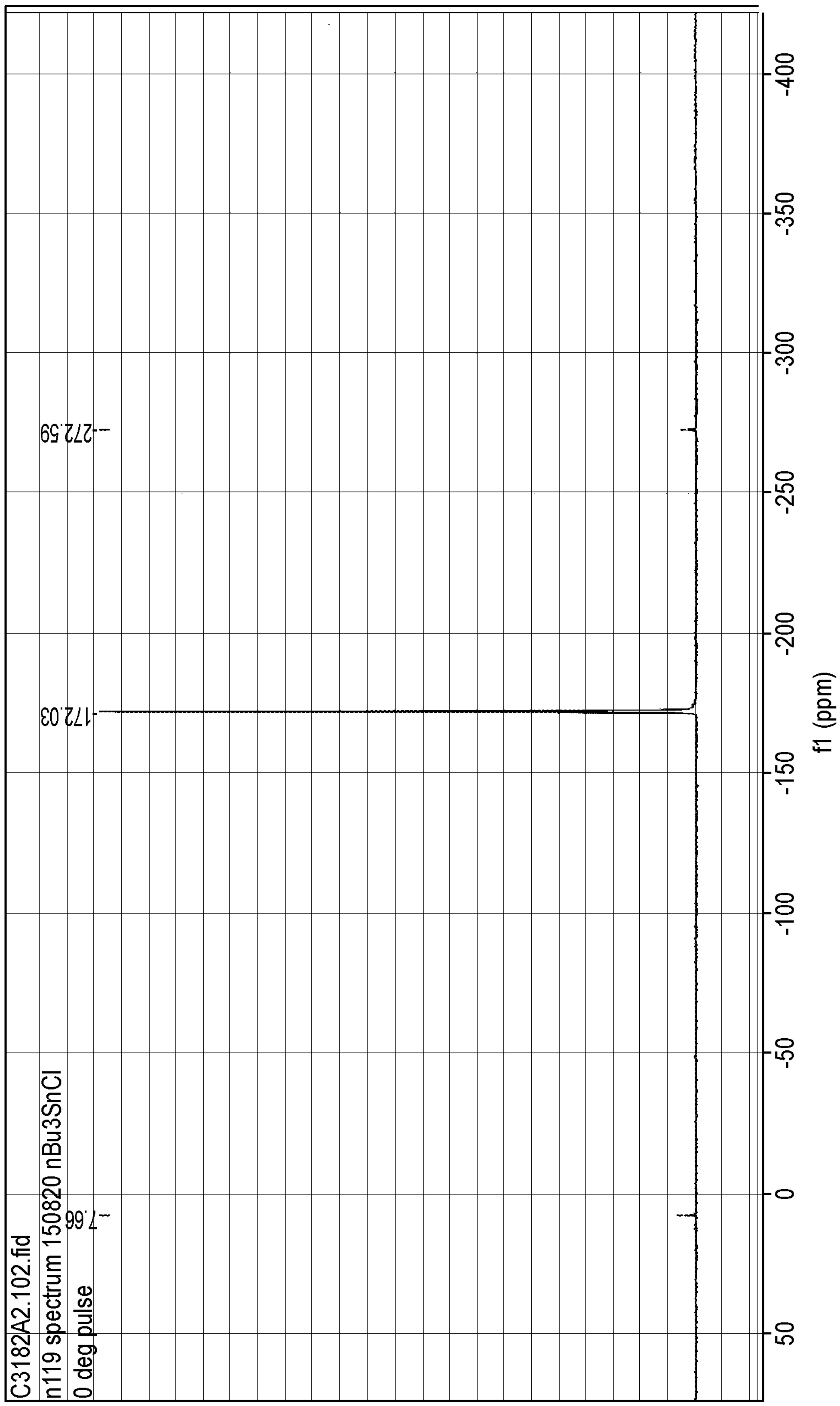
FIG. 3A is a $^{119}Sn$ NMR spectrum of $D_3Me$ Sn(t-pentoxide)$_3$ in $C_6D_6$.
Figure 3B:
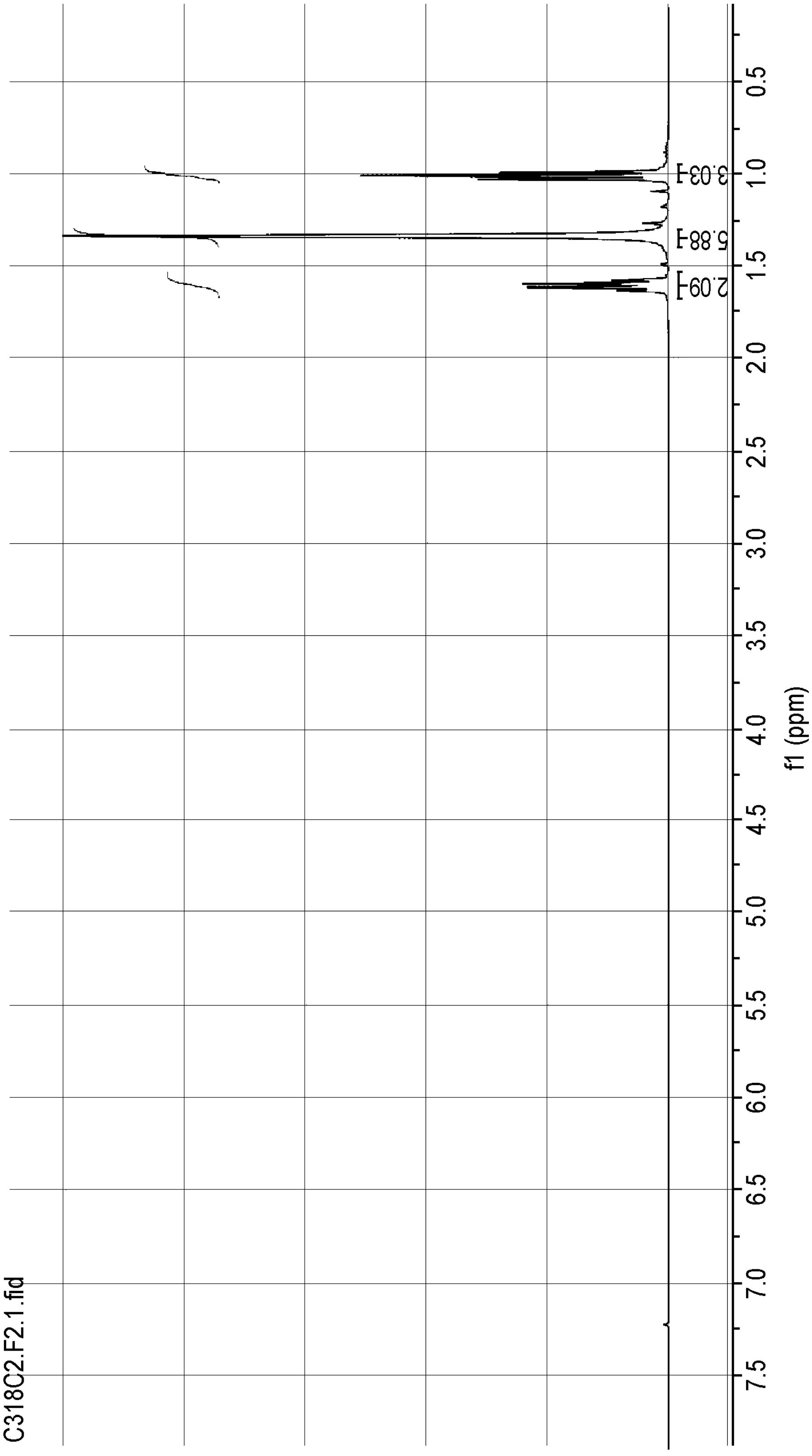
FIG. 3B is a $^1H$ NMR spectrum of $D_3Me$ Sn(t-pentoxide)$_3$ in $C_6D_6$.

The crude product d3-$MeSn(CCPh)_3$ was dissolved in 2-methyl-2-butanol (100 mL) and heated over one week, while monitoring aliquots by NMR. The volatiles were removed the conversion was found incomplete, so it was then subject to additional 2-methyl-2-butanol (100 mL) for an additional one week. The volatiles were removed and the conversion was still found to be incomplete, thus it was subject to additional 2-methyl-2-butanol (300 mL) for an additional one week. After volatiles were removed, the d3-Me $Sn(t\text{-pentoxide})_3$ product was fractionally distilled to yield a clear oil. $^{119}Sn$ and $^1H$ NMR were collected on the product in $C_6D_6$, and the spectra are shown in FIGS. 3A and 3B, respectively.

Example 4

EUV Patterning of nonadeutero-tert-butyltin tris(tert-butoxide)

The nonadeutero-tert-butyltin tris(tert-butoxide) material prepared according to Example 1 was dissolved in an appropriate amount of 4-methyl-2-pentanol to form a 0.05 M [Sn] solution. Subsequent deposition was performed via spin-coating as described below.

A series of the films were deposited at a film thickness of 23.4±0.8 nm on SOG-coated silicon wafers. The films were exposed with an NXE3400C EUV scanner employing a mask designed to print a 16P32 (16 nm linewidth on 32 nm pitch) pattern. The exposed films were baked at various temperatures and then developed with a PGME+5% acetic acid developer. Following development, the films were baked at 250° C. for 60s to eliminate developer residue.

Figure 4:
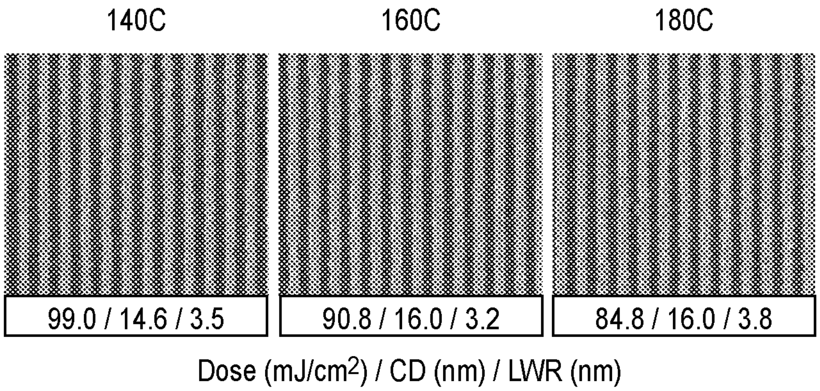
FIG. 4 is a set of electron microscope images of line-space patterns for d9-tBuSn(O-t-amyl)$_3$ resist processed at selected post-exposure bake temperatures.

The resulting patterns were imaged on a Hitachi CG5000 CD-SEM (critical dimension scanning electron microscope) with a beam voltage of 800 V and beam current of 8.0 pA. FIG. 4 shows selected images and summarizes Dose (mJ/cm2), Linewidth (CD, nm), and Linewidth Roughness (LWR, nm) for each pattern. The caption at the top of each image identifies the post-exposure bake temperature. Each pattern represents the CD closest to the target linewidth (16 nm).

Example 5

Comparison of Deuterated Compounds

This example compares the deuterated compounds prepared according to Example 1 and Example 2.

Part 1. FTIR Analysis: The nonadeutero-tert-butyltin tris(tert-butoxide) material prepared according to Example 1 ("D1") was dissolved in an appropriate amount of 4-methyl-2-pentanol to form a 0.05 M [Sn] solution. Subsequent deposition was performed via spin-coating to form a set of films ("F1") on SOG-coated silicon wafers. The films were deposited to give a pre-baked film thickness of about 28 nm. The nonadeutero-tert-butyltin tris(tert-butoxide) material prepared according to Example 2 ("D2") was also dissolved in an appropriate amount of 4-methyl-2-pentanol to form a 0.05 M [Sn] solution which was spin-coated to form a second set of films ("F2") on SOG-coated silicon wafers. The films were deposited at identical conditions as films F1 to yield a film thickness of about 28 nm. Pairs of film samples from F1 and F2 were subjected to a selected heating condition. It is believed that the coating formation results in the essentially complete hydrolysis and removal of the hydrolysable ligands so that they do not contribute to the further analysis.

Figure 5:
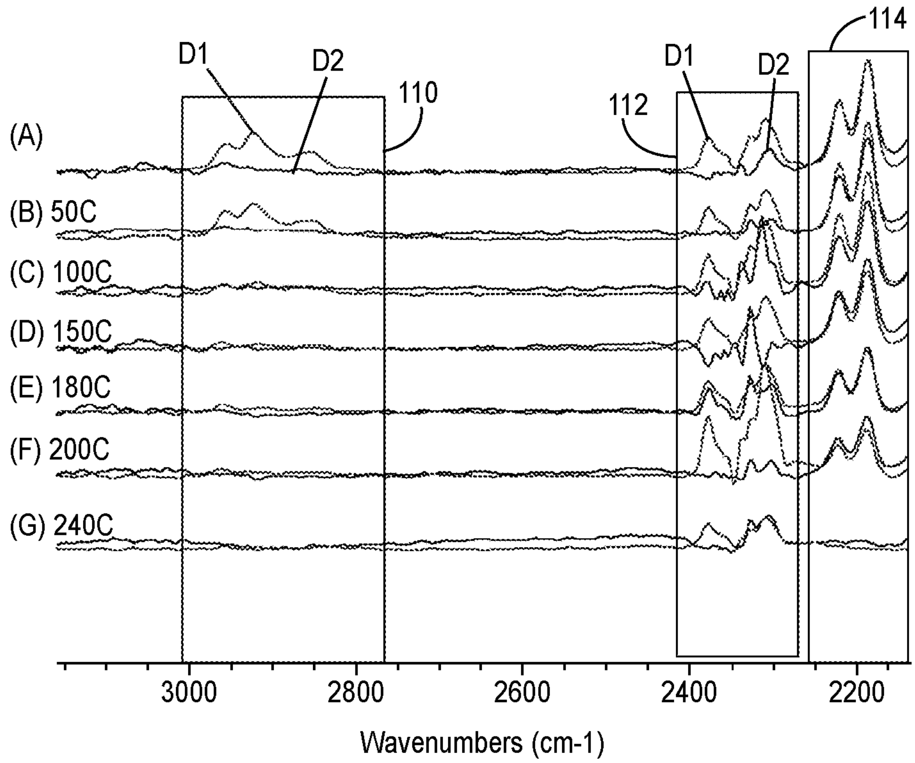
FIG. 5 is a set of stacked FTIR Spectra of films prepared with two different d9-tBuSn(O-t-Bu)$_3$ preparations and subjected to selected post-deposition heating conditions.

After the selected heating condition was completed, each film was analyzed with FTIR. FIG. 5 compares the stacked FTIR spectra of film samples F1 and F2 by heating condition: (A) no bake, (B) 50° C. bake, (C) 100° C. bake, (D) 150° C. bake, (E) 180° C. bake, (F) 200° C. bake, and (G) 240° C. bake. Each bake was 120 seconds in duration. The C—H stretching frequencies, the $CO_2$ absorption frequencies, and the C-D stretching frequencies are indicated by box 110, box 112, and box 114, respectively. Due to the FTIR measurements being conducted in ambient atmosphere, the $CO_2$ absorption regions are generally ambiguous and ignored during analysis.

Referring to the (A) spectra, the film sample from F1 showed C—H absorption peaks whereas film sample from F2 did not. Film samples from F1 and F2 showed similar C-D absorption peaks. The results indicate the presence of non-deuterated compounds in the D1 material. The non-deuterated compounds are impurities which are not present in the D2 material and thus indicate that the purity of the material prepared via the Grignard synthesis has a higher purity with respect to organic compounds than the material prepared via the oxidative stannylation synthesis. The deuterated material provides the analytical advantage of improved contrast between product and impurities. Referring to the (B)-(G) spectra, film samples from F1 showed less intense C—H absorption peaks after heating at 50° C., with the peaks not present for the films heated at 100° C. and higher. This result suggests that the impurities were polymeric compounds which were degraded at elevated temperature.

Figure 6:
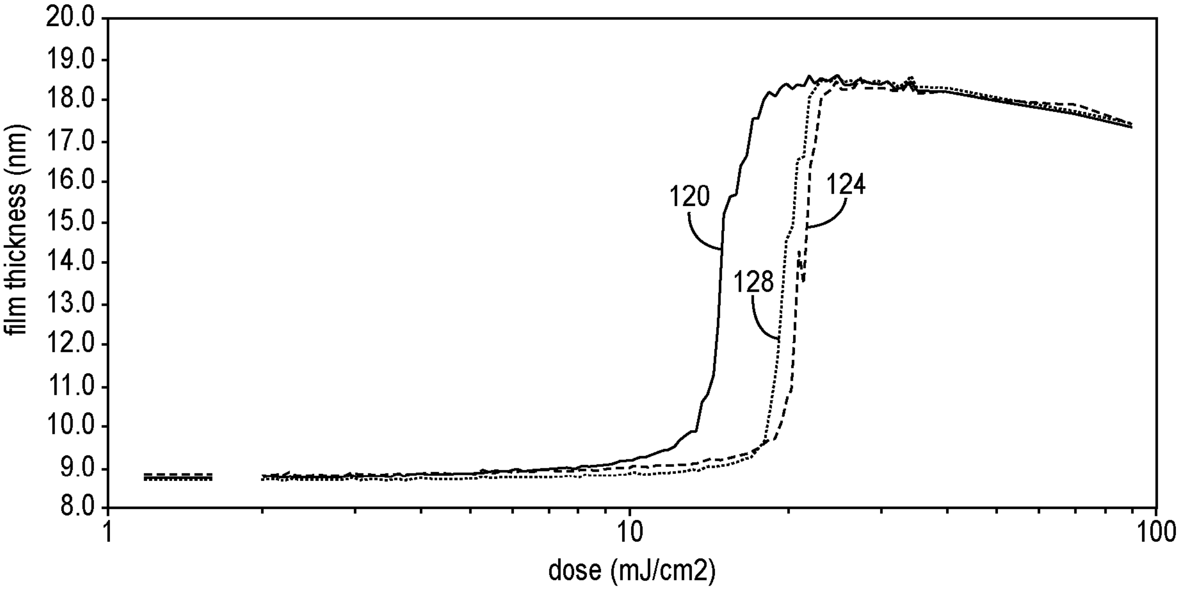
FIG. 6 is a set of contrast curves generated using a non-deuterated preparation of tBuSn(O-t-Bu)$_3$ and two different d9-tBuSn(O-t-Bu)$_3$ preparations.

Part 2. Solubility Contrast via EUV Exposure: Films were deposited onto silicon wafers as described in Part 1. Precursor solutions of D1, D2, and a non-deuterated tert-butyltin tris(tert-butoxide) ("P1") were prepared with a concentration suitable to deposit films of D1, D2, and P2, respectively, each film with a thickness of approximately 20 nm. The non-deuterated composition was prepared as described in Example 5 of the '781 application cited above with the substitution of t-butyl alcohol for t-amyl alcohol. For the contrast curves shown in FIG. 6, film thickness ranged between 18.3 nm and 18.5 nm.

Films were exposed on the EUV Direct Contrast Tool at Lawrence Berkeley National Laboratory. Prior to exposure, the films were baked at 100° C. for 2 minutes. A linear array of 50 circular exposure regions ~500 μm in diameter were projected onto the wafer with increasing EUV exposure doses. After exposure, the films were baked at 180° C. for 1 minute and then developed with a solution of 5 vol. % acetic acid in PGMEA. The thickness of each exposed pad was assessed with a J. A. Woollam M-2000 spectroscopic ellipsometer. The thickness of each pad is plotted as a function of EUV dose in FIG. 6. Contrast curves 120, 124, and 128 correspond to films of P1, D1, and D2, respectively. In unexposed and low-dose regions, the film thickness was about 8.6 to 8.8 nm, which corresponds to the thickness of the SOG coating. The curves rise to a maximum thickness ranging from 18.3 nm to 18.5 nm. The maximum thickness for contrast curve 120 (material P1) and contrast curve 128 (material D2) was nearly identical, with contrast curve 128 (material D1) showing a slightly lower maximum thickness. Table 1 summarizes process conditions, developer composition, and derived results ($D_o$, Dg, and contrast) for each material.

TABLE 1

| Material/ Curve | Bake (° C./min) | Developer | $D_g$ | $D_o$ | Contrast Value |
|---|---|---|---|---|---|
| P1/120 | 100/2 | 5% acetic acid in PGMEA | 15.9 | 11.3 | 6.7 |
| D1/124 | 100/2 | 5% acetic acid in PGMEA | 22.6 | 13.6 | 4.6 |
| D2/128 | 100/2 | 5% acetic acid in PGMEA | 21.1 | 14.1 | 5.7 |

The results result show that the deuterated materials D1 and D2 have a different radiation sensitivity than the non-deuterated material. D1 and D2 had a dose-to-gel that was about 50% greater than the dose-to-gel for P1. This slower response at equivalent processing conditions was an expected consequence of the heavy atoms. However, D1 and D2 showed similar solubility contrast than P1. This high contrast in material properties facilitates the formation of high-resolution lines with smooth edges in the pattern, such as demonstrated in Example 4. Comparing the two deuterated materials, D2 shows a slightly lower dose-to-gel than D1 as well as had better solubility contrast than D1. The results suggest that the radiation sensitivity for the deuterated materials is correlated with the presence of the impurity as identified and described in the FTIR analysis of Part 1, and therefore is dependent on synthesis route, with the Grignard method providing for material having a lower $D_g$. improved EUV contrast. The results of Part 1 suggest that the improved contrast for D2 is related to a reduction in impurities.

This example demonstrates differences between deuterated and non-deuterated organotin materials. Deuterated organotin materials have analytical advantages over non-deuterated organotin materials and can be used to tailor patterning performance.

Further inventive concepts:

A. A method for synthesizing a monoorgano tin trialkoxide, monoorgano tin tri acetylide or monoorgano tin tricarboxylate, the method comprising, reacting a Grignard alkylating agent RMgX with $SnL_4$ in a solution comprising an organic solvent, where R is a hydrocarbyl group with 1-31 carbon atoms, where X is a halogen, and where R' is a hydrocarbyl group with 1-10 carbon atoms, and L is R'COO, CCR' or OR', where R' has 1 to 10 carbon atoms and optional heteroatoms.

A1. The method of claim 1 wherein R comprises at least one deuterium atom.

A2. The method of claim A wherein R comprises an alkyl, a cycloalkyl, an alkenyl, an alkynyl, or an aryl group having at least 1 hydrogen atom substituted with deuterium.

A3. The method of claim A wherein R is perdeuterated.

A4. The method of claim A wherein R bondds to the tin at a secondary or tertiary carbon.

A5. The method of claim A wherein R comprises cyano, thio, ether, keto, ester, halogenated groups, or combinations thereof.

A6. The method of claim A wherein R' is methyl or ethyl.

A7. The method of claim A wherein RMgX and $Sn(L)_4$ are in an approximate 1:1 molar ratio.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A deuterated organotin compound represented by the formula $RSnL_3$, wherein R is a deuterated hydrocarbyl group having greater than a natural abundance of deuterium and L is a hydrolysable ligand comprising —$NR'_2$, —OR', —R'COO—, —CC(R'), —CC($SiR'_3$) wherein R' is an hydrocarbyl group having no more than 30 carbon atoms, R optionally comprises other heteroatoms, and wherein R forms a tin-carbon bond.

2. The deuterated organotin compound of claim 1 wherein R comprises an alkyl, a cycloalkyl, an alkenyl, an alkynyl, or an aryl group having at least 1 hydrogen atom substituted with deuterium.

3. The deuterated organotin compound of claim 1 wherein R comprises a perdeuterated group comprising an alkyl, a cycloalkyl, an alkenyl, an alkynyl, or an aryl.

4. The deuterated organotin compound of claim 1 wherein R comprises a branched alkyl group.

5. The deuterated organotin compound of claim 1 wherein R comprises cyano, thio, ether, keto, ester, halogenated groups, or combinations thereof.

6. The deuterated organotin compound of claim 1 wherein R is $(CD_3)_3C$—.

7. The deuterated organotin compound of claim 1 wherein R is $CD_3$-.

8. The deuterated organotin compound of claim 1 wherein R is $(CD_3)_2CD$—.

9. The deuterated organotin compound of claim 1 wherein L comprises —$NMe_2$, —$NEt_2$, —OiPr, —OtBu, —OtAmyl, —$CC(Si(CH_3)_3)$, —$CC(C_6H_5)$, or a combination thereof.

10. The deuterated organotin compound of claim 1 wherein the organotin compound is perdeuterated.

11. The deuterated organotin compound of claim 1 wherein the organotin compound comprises nonadeutero-tert-butyltin tris(tert-butoxide), trideuteromethyltin tris(phenylacetylide), or trideuteromethyltin tris(tert-pentoxide).

12. A precursor solution comprising an organic solvent and the deuterated organotin compound of claim 1.

13. The precursor solution of claim 12 further comprising one or more organotin compositions having the formula $R_nS_nX_{4-n}$, wherein n is 2, 3, or 4, R is a hydrocarbyl group, and X is a hydrolysable ligand.

14. The precursor solution of claim 12 wherein the organic solvent comprises an alcohol, an aromatic hydrocarbon, an aliphatic hydrocarbon, an ester, an ether, a ketone, or combinations thereof, and wherein the solution has a concentration from about 0.005M to about 1.4M based on tin concentration.

15. The precursor solution of claim 12 wherein the organic solvent comprises 4-methyl-2-pentanol.

16. The deuterated organotin compound of claim 1 wherein the deuterated hydrocarbyl group has an extent of deuteration at a deuteration site of at least about 50 mole %.

17. The deuterated organotin compound of claim 1 wherein the deuterated hydrocarbyl group has more than 99% deuterium enrichment.

18. The deuterated organotin compound of claim 1 wherein the deuterated hydrocarbyl group is sensitive to EUV radiation.

* * * * *